US008368183B2

(12) United States Patent
Yamada et al.

(10) Patent No.: US 8,368,183 B2
(45) Date of Patent: Feb. 5, 2013

(54) NITRIDE SEMICONDUCTOR DEVICE

(75) Inventors: Eiji Yamada, Mihara (JP); Takeshi Kamikawa, Mihara (JP); Masahiro Araki, Ube (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 288 days.

(21) Appl. No.: 11/263,036

(22) Filed: Nov. 1, 2005

(65) Prior Publication Data

US 2006/0094244 A1    May 4, 2006

(30) Foreign Application Priority Data

| Nov. 2, 2004 | (JP) | 2004-319183 |
| Nov. 5, 2004 | (JP) | 2004-322339 |
| Sep. 2, 2005 | (JP) | 2005-254510 |

(51) Int. Cl.
*H01L 29/04* (2006.01)

(52) U.S. Cl. ............... 257/628; 257/E21.108; 257/627; 438/42; 438/44; 438/46

(58) Field of Classification Search .......... 257/79, 257/618, 629, 52, 49, 103, 628, 615; 438/22, 438/46, 604, 479; 372/45
See application file for complete search history.

(56) References Cited

U.S. PATENT DOCUMENTS

| 6,051,477 A * | 4/2000 | Nam .............................. 438/404 |
| 6,106,128 A * | 8/2000 | Zou et al. ....................... 362/606 |
| 6,323,059 B1 | 11/2001 | Yoshida et al. |
| 6,680,959 B2 * | 1/2004 | Tanabe et al. .............. 372/45.01 |
| 6,797,991 B2 * | 9/2004 | Ishida ........................... 257/103 |
| 6,812,496 B2 * | 11/2004 | Takatani et al. ................. 257/79 |
| 7,338,827 B2 * | 3/2008 | Sugahara et al. ............... 438/41 |
| 7,339,255 B2 * | 3/2008 | Tachibana et al. ............ 257/628 |
| 2001/0030329 A1 * | 10/2001 | Ueta et al. ..................... 257/103 |
| 2003/0132441 A1 * | 7/2003 | Takatani et al. ................. 257/79 |
| 2003/0170503 A1 * | 9/2003 | Shibata et al. ................ 428/698 |

(Continued)

FOREIGN PATENT DOCUMENTS

| CN | 1247387 | 3/2000 |
| JP | 2000-106455 | 4/2000 |

(Continued)

OTHER PUBLICATIONS

Office Action for corresponding Chinese Application mailed Jul. 6, 2007.

(Continued)

*Primary Examiner* — William F Kraig
(74) *Attorney, Agent, or Firm* — Harness, Dickey & Pierce, P.L.C.

(57) ABSTRACT

A nitride semiconductor device is provided that prevents development of cracks, that has nitride semiconductor thin films with uniform thicknesses and good growth surface flatness, and is thus consistent in characteristics, and that can be fabricated at a satisfactory yield. In this nitride semiconductor device, the nitride semiconductor thin films are grown on a substrate having an off-angle between a direction normal to the surface of ridges and the crystal direction <0001>. This helps either reduce or intentionally promote diffusion or movement of the atoms or molecules of a source material of the nitride semiconductor thin films through migration thereof. As a result, a nitride semiconductor growth layer with good surface flatness can be formed, and thus a nitride semiconductor device with satisfactory characteristics can be obtained.

22 Claims, 22 Drawing Sheets

CRYSTAL DIRECTIONS θ a° OFF ABOUT <11-20>

U.S. PATENT DOCUMENTS

| | | |
|---|---|---|
| 2004/0026710 A1 | 2/2004 | Tsuda et al. |
| 2004/0041156 A1* | 3/2004 | Tsuda et al. .................... 257/79 |
| 2005/0025204 A1* | 2/2005 | Kamikawa et al. ............ 372/43 |
| 2005/0026398 A1* | 2/2005 | Nakamura .................... 438/479 |
| 2005/0037526 A1* | 2/2005 | Kamiyama et al. ............ 438/22 |
| 2005/0101100 A1* | 5/2005 | Kretchmer et al. ........... 438/424 |
| 2005/0141577 A1* | 6/2005 | Ueta et al. ........................ 372/43 |
| 2005/0151153 A1* | 7/2005 | Kamikawa et al. ........... 257/103 |
| 2005/0186694 A1* | 8/2005 | Takakura et al. ................ 438/28 |
| 2005/0224783 A1* | 10/2005 | Matsuyama et al. ............ 257/14 |
| 2006/0166478 A1 | 7/2006 | Sugahara et al. |

FOREIGN PATENT DOCUMENTS

| | | |
|---|---|---|
| JP | 2000-223743 | 8/2000 |
| JP | 2001-160539 | 6/2001 |
| JP | 2001-196632 | 7/2001 |
| JP | 2002-016000 | 1/2002 |
| JP | 2002-151796 | 5/2002 |
| JP | 2002-158405 | 5/2002 |
| JP | 2002-204035 | 7/2002 |
| JP | 2002-208724 | 7/2002 |
| JP | 2002-217498 | 8/2002 |
| JP | 2002-222746 | 8/2002 |
| JP | 2002-246698 | 8/2002 |
| JP | 2002-344088 | 11/2002 |
| JP | 2003-258381 | 9/2003 |
| JP | 2004-311964 | 11/2004 |
| JP | 2004-327879 | 11/2004 |
| JP | 2004-356454 | 12/2004 |
| JP | 2005-056974 | 3/2005 |
| JP | 2005-056979 | 3/2005 |
| JP | 2005-064469 | 3/2005 |
| JP | 2005-197347 | 7/2005 |
| WO | WO 2004086579 A1 * | 10/2004 |

OTHER PUBLICATIONS

Material for Information Disclosure Statement.

* cited by examiner

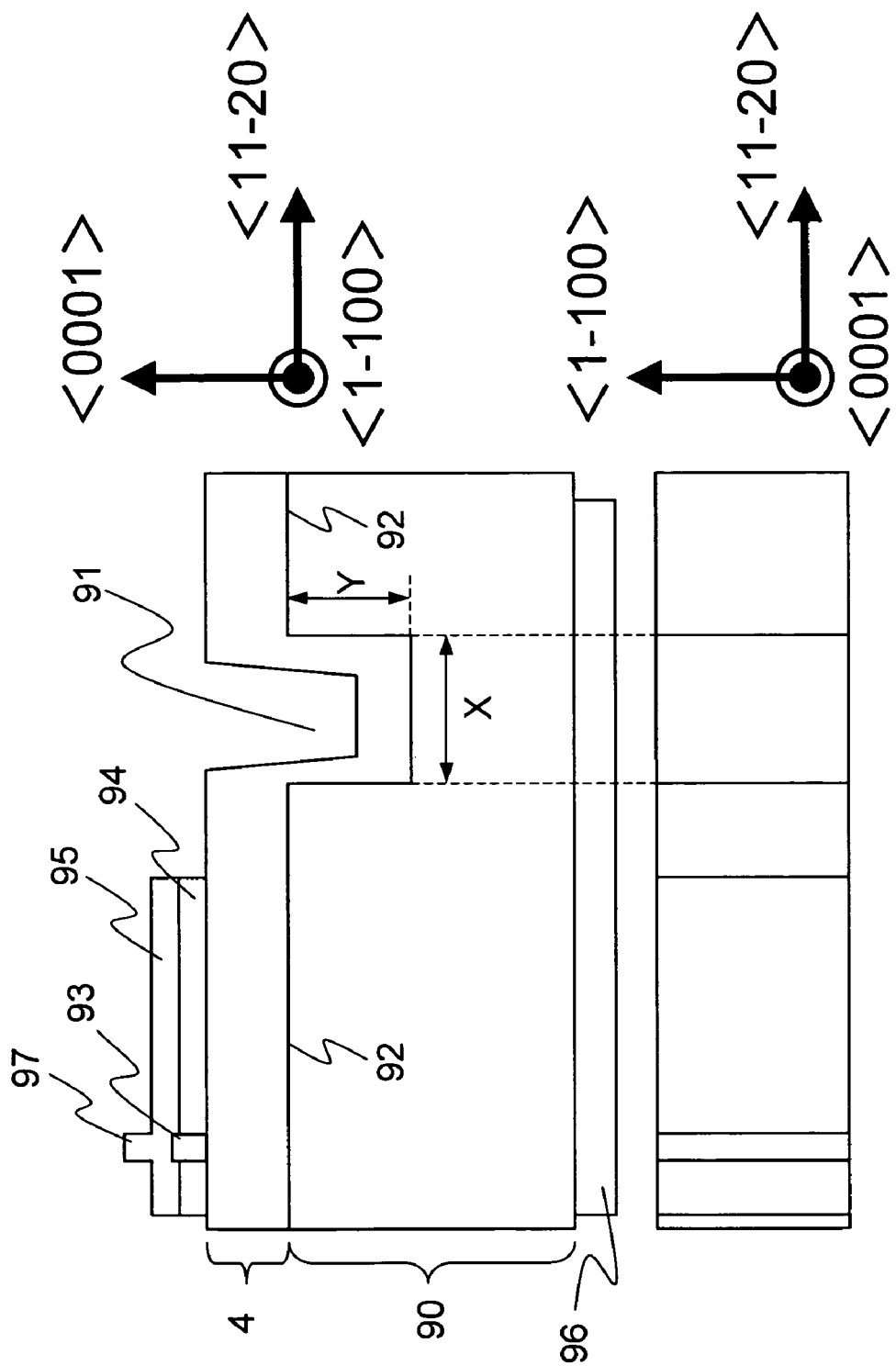

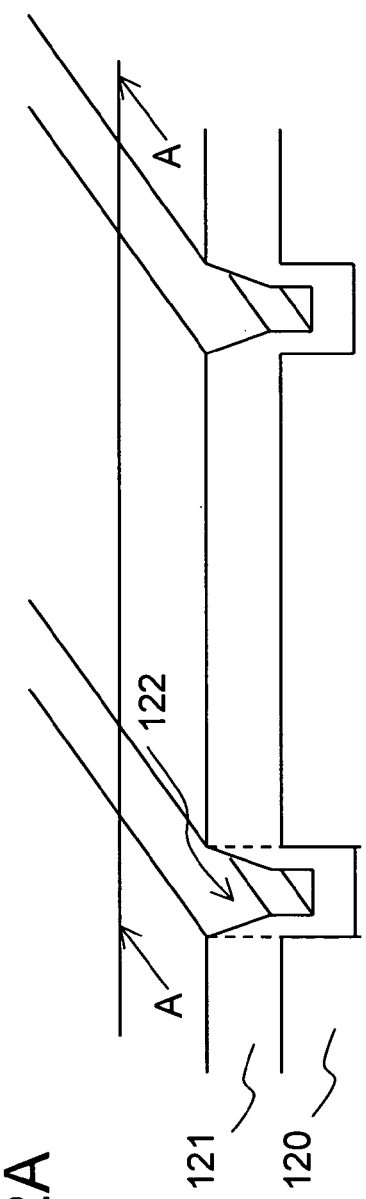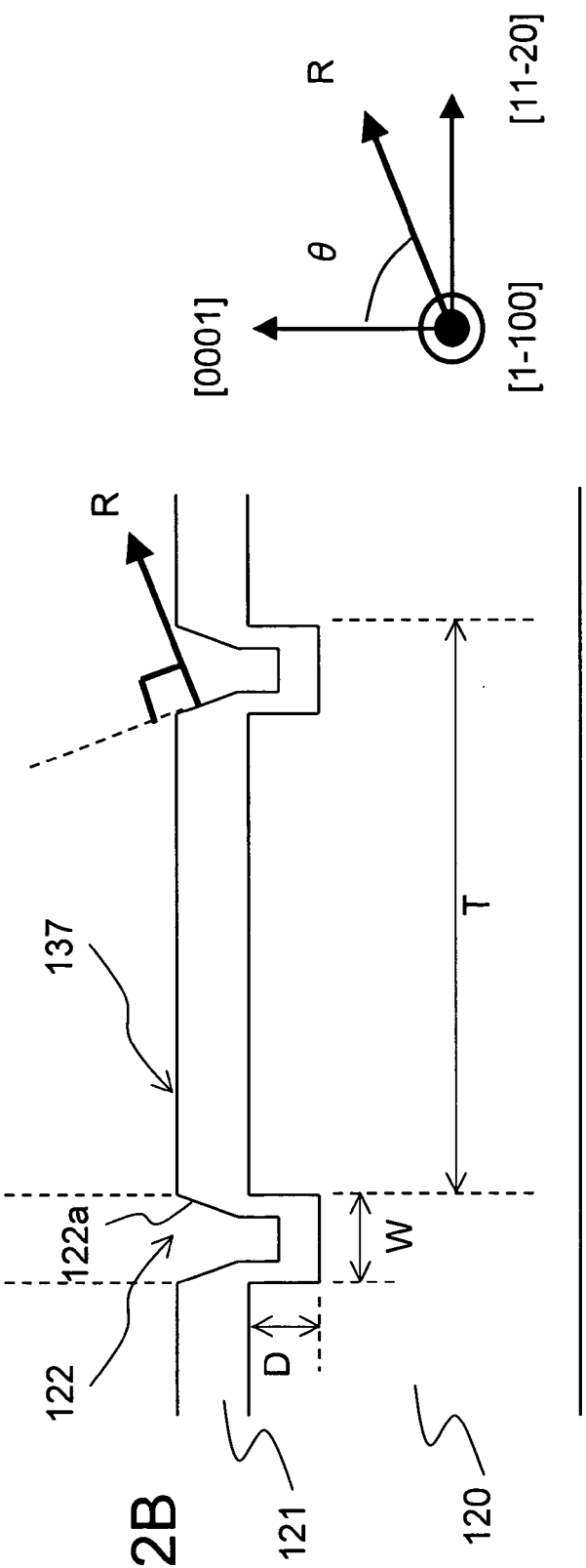
FIG.12A
FIG.12B

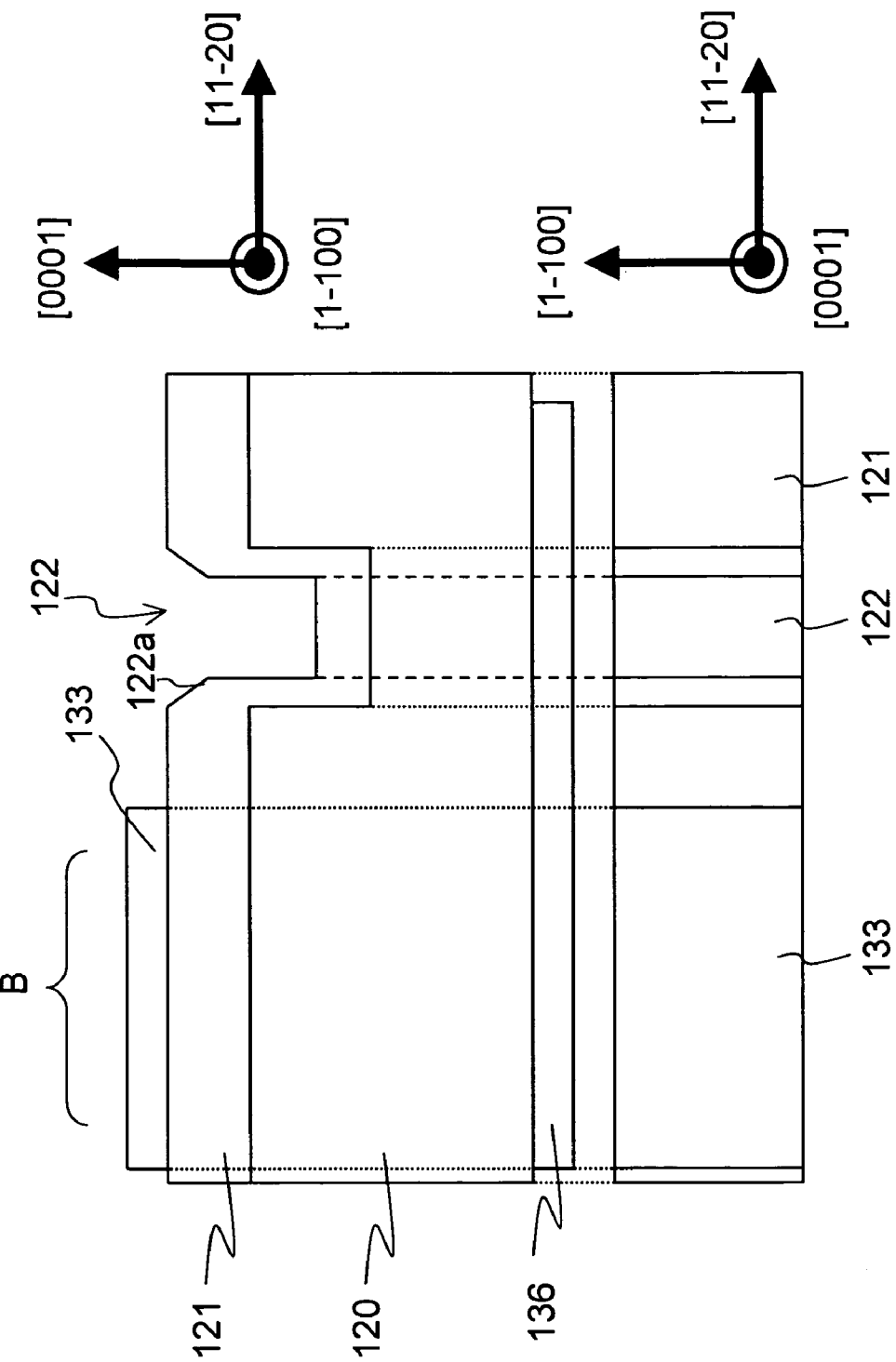

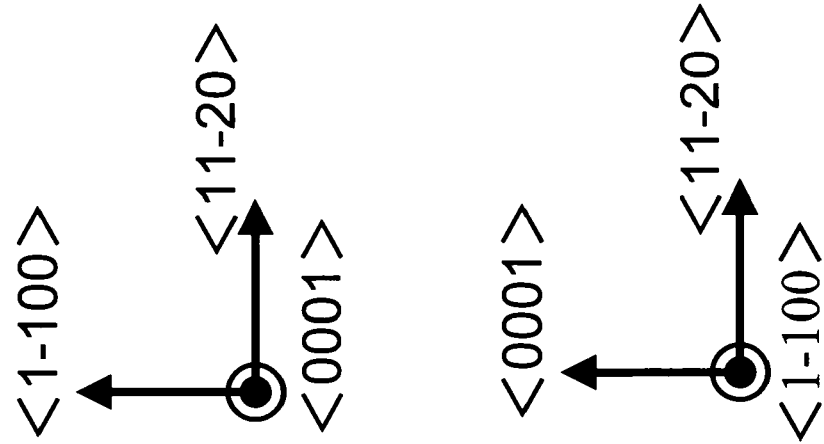
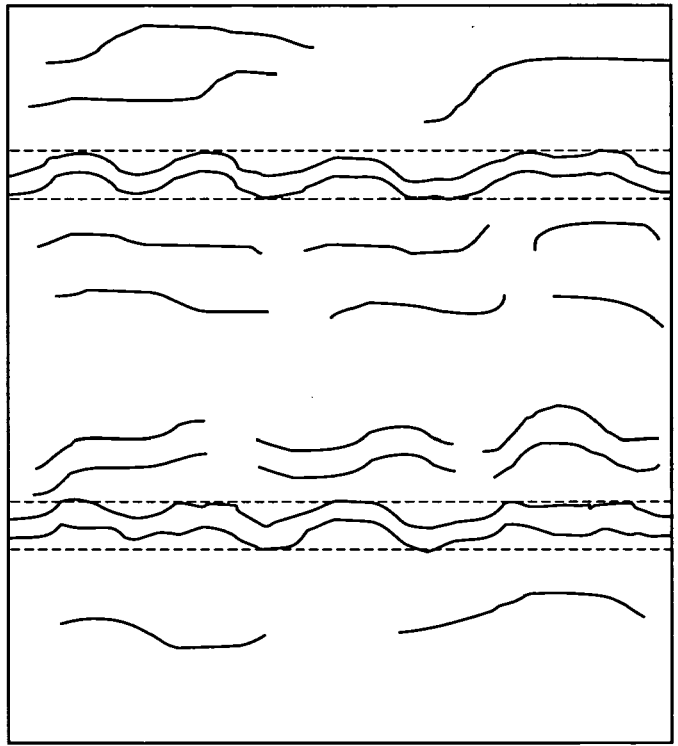
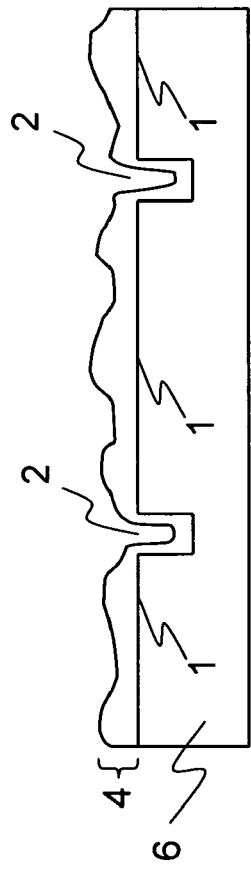
FIG.19A PRIOR ART
FIG.19B

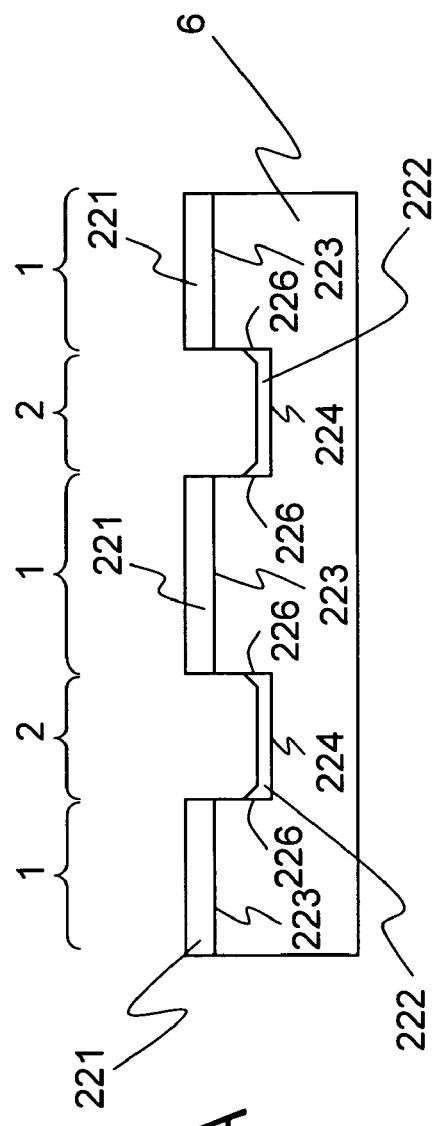
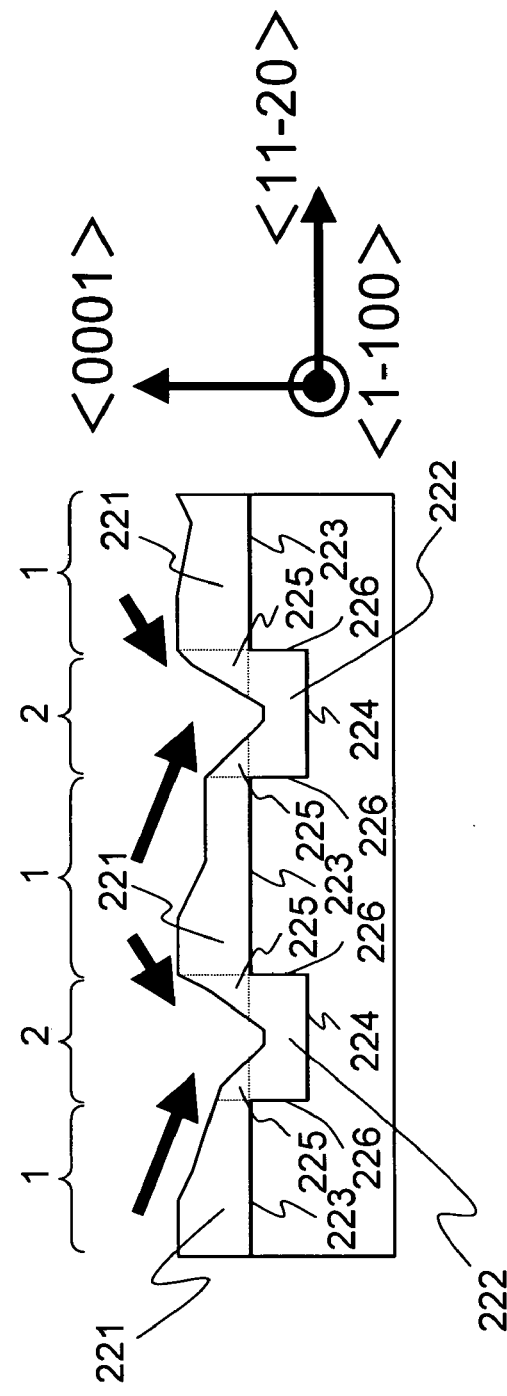

NITRIDE SEMICONDUCTOR DEVICE

This nonprofessional application claims priority under 35 U.S.C. §119(a) on Patent Application No. 2004-319183 filed in Japan on Nov. 2, 2004 and Patent Application No. 2004-322339 filed in Japan on Nov. 5, 2004, the entire contents of which are hereby incorporated by reference.

BACKGROUND OF THE INVENTION

1. Field of the Invention

The present invention relates to a nitride semiconductor device. More particularly, the present invention relates to a nitride semiconductor device that uses a nitride semiconductor substrate of which at least the surface is formed of a nitride semiconductor, and to a fabrication method of such a nitride semiconductor device.

2. Description of Related Art

Nitride semiconductors such as GaN, AlGaN, GaInN, and AlGaInN are characterized by having larger band gaps Eg than AlGaInAs- or AlGaInP-based semiconductors and by being direct-transition semiconductor materials. For these reasons, nitride semiconductors have been receiving much attention as materials for producing semiconductor light-emitting devices such as semiconductor lasers that can emit light at short wavelengths from ultraviolet to green regions of spectrum and light-emitting diodes that cover a wide range of light emission wavelengths from ultraviolet to red regions of spectrum. Thus, nitride semiconductors are expected to find wide application in high-density optical disc drives, full-color displays, and other appliances, and further in environmental, medical, and other fields.

Moreover, nitride semiconductors have higher thermal conductivity than GaAs-based or other semiconductors, and are thus expected to find application in devices that operate at high temperatures and high outputs. Furthermore, nitride semiconductors do not require any material such as arsenic (As) as used in AlGaAs-based semiconductors or cadmium (Cd) as used in ZnCdSSe-based semiconductors, nor do they require any source material or the like therefor such as arsine ($AsH_3$), and are thus expected as compound semiconductor materials that are environmentally benign.

Conventionally, however, the fabrication of, among different types of nitride semiconductor devices, nitride semiconductor laser devices suffers from extremely low yields; that is, relative to the total number of nitride semiconductor laser devices fabricated on a single wafer, the number of non-defective ones is extremely low. One reason for low yields is believed to be development of cracks. The cause for cracks may lie in a substrate itself or in the process of laying on a substrate a nitride semiconductor multiple-layer film composed of a plurality of nitride semiconductor layers (nitride semiconductor thin films) laid on one another.

It is intrinsically preferable to form a nitride semiconductor multiple-layer film, such as one formed of GaN, by growing it on a GaN substrate, because doing so helps produce a nitride semiconductor multiple-layer film with good crystallinity and few defects. Up to date, however, no high-quality GaN single-crystal substrate has been developed that exhibits good lattice match with GaN. For this reason, a SiC substrate is often used instead because of the comparatively small difference in lattice constant. Disadvantageously, however, SiC substrates are expensive, are difficult to produce in large diameters, and develop tensile strain. As a result, SiC substrates are prone to develop cracks. Moreover, the substrate of a nitride semiconductor is required to be formed of a material that withstands a high growth temperature of about 1000° C. and that resists discoloration and corrosion in an atmosphere of ammonia gas used as a source material.

Out of the above considerations, a sapphire substrate is typically used as a substrate on which to lay a nitride semiconductor multiple-layer film. Sapphire substrates, however, cause large lattice mismatch (about 13%). For this reason, on a sapphire substrate, first a buffer layer formed of GaN or AlN is formed by low-temperature growth, and then, on this buffer layer, a nitride semiconductor multiple-layer film is grown. Even then, it is difficult to completely eliminate strain, resulting in development of cracks depending on conditions such as the film composition and film thickness.

The cause for such cracks may lie elsewhere than in the substrate, as will be described below. When a nitride semiconductor laser device is fabricated, a nitride semiconductor multiple-layer film is laid on a substrate, and the nitride semiconductor multiple-layer film is composed of different types of film, such as GaN, AlGaN, and InGaN. Here, the individual films of which the nitride semiconductor multiple-layer film is composed have different lattice constants, and thus exhibit lattice mismatch, causing development of cracks. As a countermeasure against this, there has been proposed a method for reducing cracks according to which a processed substrate is used so that, after a nitride semiconductor multiple-layer film is grown thereon, the surface of the nitride semiconductor multiple-layer film is not flat but has concave areas formed thereon (see Japanese Patent Application Laid-open No. 2002-246698). By using, for example, the method disclosed in Japanese Patent Application Laid-open No. 2002-246698, it is possible to reduce cracks that develop as a result of lattice mismatch among the individual films of which a nitride semiconductor multiple-layer film formed on a substrate is composed. Disadvantageously, however, with the method disclosed in Japanese Patent Application Laid-open No. 2002-246698, the concave areas formed on the surface of the nitride semiconductor multiple-layer film degrade the flatness thereof.

As a countermeasure against such degraded flatness on the surface of a nitride semiconductor multiple-layer film, the inventors of the present invention have developed a method according to which trenches, in the form of one to several stripe-shaped grooves per nitride semiconductor laser device, and ridge portions, each located between two adjacent trenches and having a width of about 100 μm to 1 000 μm, are formed on a nitride semiconductor substrate and then, on this nitride semiconductor substrate, a nitride semiconductor multiple-layer film is laid. With this method, it is possible to prevent cracks, and simultaneously to obtain reasonably improved surface flatness on the surface of the ridge portions.

When a nitride semiconductor laser device is fabricated by the above-described method developed by the inventors of the present invention, a nitride semiconductor multiple-layer film is structured, for example, as shown in FIG. 20.

Specifically, the nitride semiconductor multiple-layer film 4 formed on the surface of a processed substrate 6 (see FIG. 19) formed of etched n-type GaN or the like has, for example, the following layers laid one after another in the order in which they are named on the surface of the processed substrate 6: an n-type GaN layer 200 having a layer thickness of 0.2 μm; an n-type $Al_{0.05}Ga_{0.95}N$ first clad layer 201 having a layer thickness of 0.75 μm; an n-type $Al_{0.05}Ga_{0.92}N$ second clad layer 202 having a layer thickness of 0.1 μm; an n-type $Al_{0.05}Ga_{0.95}N$ third clad layer 203 having a layer thickness of 1.5 μm; an n-type GaN guide layer 204 having a layer thickness of 0.02 μm; an active layer 205 composed of three InGaN well layers each having a layer thickness of 4 nm and four GaN barrier layers each having a layer thickness of 8 nm; a p-type $Al_{0.3}Ga_{0.7}N$ evaporation prevention layer 206 having a layer thickness of 20 nm; a p-type GaN guide layer 207 having a layer thickness of 0.02 μm; a p-type $Al_{0.05}Ga_{0.95}N$ clad layer 208 having a layer thickness of 0.5 μm; and a p-type GaN contact layer 209 having a layer thickness of 0.1 μm. The active layer 205 has the following layers formed one after another in the order in which they are named: a barrier layer, a well layer, a barrier layer, a well layer, a barrier layer, a well layer, and a barrier layer. In the following description, the term "p-layers" is used whenever necessary to refer to the nitride semiconductor layer composed of the layers doped with Mg laid on one another, namely the p-type $Al_{0.3}Ga_{0.7}N$ evaporation prevention layer 206, the p-type GaN guide layer 207, the p-type $Al_{0.05}Ga_{0.95}N$ clad layer 208, and the p-type GaN contact layer 209.

Thus, the nitride semiconductor multiple-layer film 4 is laid, by MOCVD, on the surface of the processed substrate 6, which has previously been processed. In this way, a nitride semiconductor wafer having concave areas on the surface of the nitride semiconductor multiple-layer film 4 as shown in FIG. 19 is produced. In FIG. 19, the plane directions are indicated together.

Used as the processed substrate 6 shown in FIG. 19 is an n-type GaN substrate that has trenches 2 and ridges 1, both in the shape of stripes, formed thereon in the <1-100> direction by a dry etching technique such as RIE (reactive ion etching). The trenches are formed with a width of 5 μm, with a depth of 5 μm, and with a period of 350 μm between two adjacent trenches. On the processed substrate 6 so etched, the nitride semiconductor multiple-layer film 4 having a layered structure as shown in FIG. 20 is formed by a growth technique such as MOCVD.

When nitride semiconductor laser devices were actually fabricated by the above-described method developed by the inventors of the present invention, by using an n-type GaN substrate as the processed substrate 6 and then epitaxially growing the nitride semiconductor multiple-layer film 4 on the n-type GaN substrate by MOCVD or the like, it was found that the method was effective in reducing cracks but not in notably increasing yields. Specifically, by the above-described method, a plurality of nitride semiconductor laser devices were fabricated, from which 100 nitride semiconductor laser devices were then randomly sampled and subjected to measurement of the FWHM (full width at half maximum) of their FFP in the horizontal and vertical directions. Here, nitride semiconductor laser devices whose actual FFP FWHM was within ±1 degree of the design value thereof were counted as non-defective ones. The result was that only 30 nitride semiconductor laser devices met the requirement for the FWHM of their FFP, indicating a very low yield.

This is because the surface of the nitride semiconductor multiple-layer film 4 formed was not sufficiently flat. With insufficient surface flatness, the layer thicknesses of the individual layers vary within the nitride semiconductor multiple-layer film 4, causing variations in characteristics among individual nitride semiconductor laser devices. This reduces the number of devices that have characteristics within the required ranges. Accordingly, to increase yields, it is necessary not only to reduce development of cracks, but also to make the layer thicknesses more uniform and the film surface more flat.

It was also found that, when an electrode pad is formed on a surface that is poorly flat because of concave areas, current leaks via those concave areas, making it impossible to obtain a normal current-voltage (V-V) characteristic in lasers. Basically, an insulating film such as $SiO_2$ is formed on concave areas, and electrode pads are formed further on top. Here, if the surface has non-flat regions such as concave areas, the insulating film formed thereon is not formed uniformly. When the insulating film was analyzed, it was confirmed that it had many regions where small cracks and pits had developed and where the insulating film was extremely thin. And it was found that this non-uniform insulating film was the cause for current leakage.

Moreover, surface flatness was measured within the wafer surface of the nitride semiconductor wafer produced as shown in FIGS. 19 and 20. The result of the measurement of surface flatness in the <1-100> direction is shown in FIG. 21. The measurement was performed under the following conditions: measurement length, 600 μm; measurement duration, 3 s; probe pressure, 30 mg; and horizontal resolution 1 μm per sample. Within the 600 μm wide region so measured, the level difference between the highest and lowest parts of the surface was, as will be understood from the graph in FIG. 21, 30 nm. In this measurement, the nitride semiconductor wafer is assumed to have an off-angle of 0.02° or less.

This difference in flatness results from the fact that, as shown in FIG. 19B, the film thicknesses of the individual layers of the nitride semiconductor multiple-layer film 4 laid on the surface of the processed substrate 6 vary from place to place within the surface of the wafer. As a result, the characteristics of nitride semiconductor laser devices vary depending on where on the surface of the wafer they are fabricated, and the Mg-doped p-layer thickness (corresponding to the sum of the thicknesses of the p-layers laid on one another as the p-type $Al_{0.3}Ga_{0.7}N$ evaporation prevention layer 206 to the p-type GaN contact layer 209 shown in FIG. 20), which greatly affects the characteristics of nitride semiconductor laser devices, greatly varies from place to place within the surface of the substrate.

When a ridge structure as a current constriction structure is formed, ridge portions are left in the shape of 2 μm wide stripes and other portions are etched away by a dry etching technique using an ICP (inductively coupled plasma) machine. Thus, if the p-layer thickness before etching varies from place to place within the surface of the wafer, the remaining p-layer film thickness, that is, the p-layer thickness that remains after etching and that therefore most greatly affects the characteristics of nitride semiconductor laser devices, also greatly varies from place to place within the surface of the wafer. As a result, not only do the layer thicknesses vary among nitride semiconductor laser devices, but also, even within a single nitride semiconductor laser device, the remaining p-layer film thickness is almost zero in some parts thereof while being considerably large in other parts thereof. When the remaining p-layer film thickness varies in this way, it affects the lifetime of nitride semiconductor laser devices and also, as described above, the characteristics thereof such as the FFP (far-field pattern).

The reason that a large layer thickness distribution exists within the wafer surface as described above is believed to be that the growth speed of the film grown epitaxially on ridge-shaped portions of the processed substrate including the nitride semiconductor substrate varies under the influence of trenches, resulting in degraded uniformity within the wafer surface.

Specifically, as shown in FIG. 22, on a processed substrate 6 having trenches 2 formed thereon, when epitaxial growth is started, at an initial stage of growth, as shown in FIG. 22A, trench growth portions 222 formed by the nitride semiconductor thin films grown on floor portions 224 and side portions 226 of the trenches 2 fill only part of the trenches 2. Meanwhile, top growth portions 221 formed by the nitride semiconductor thin films grown on the surface of top portions 223 of ridges 1 grows while keeping the surface of the nitride semiconductor thin films flat.

The epitaxial growth of the nitride semiconductor thin films progresses from the above-described state shown in FIG. 22A to the state shown in FIG. 22B. In this state, the trench growth portions 222 formed by the nitride semiconductor thin films grown on the floor portions 224 and side portions 226 of the trenches 2 almost completely fill the trenches 2, and become linked, via growth portions 225, to the top growth portions 221 formed by the nitride semiconductor thin films grown on the surface of the top portions 223 of the ridges 1. In this state, the atoms or molecules (such as Ga atoms) that have deposited as a source material on the surface of the nitride semiconductor thin films grown on the top portions 223 of the ridges 1 undergo migration or the like under the influence of heat energy to move into the growth portions 225 or the trench growth portions 222. This movement of atoms or molecules resulting from migration thereof occurs non-uniformly within the wafer surface, and the movement distance varies from place to place within the wafer surface. As a result, as shown in FIG. 22B, the flatness of the surface of the top growth portions 221 is degraded.

The flatness of the nitride semiconductor thin films is degraded also in the <1-100> direction under the influence of non-uniformity of the nitride semiconductor substrate itself, such as the distribution of the off-angle within the wafer surface and the distribution of the substrate curvature within the wafer surface, or non-uniformity of the epitaxial growth speed within the substrate surface, or non-uniformity of the trench forming process within the substrate surface. Specifically, the time required to fill the trenches 2 varies depending on the <1-100> direction; thus, where they are filled earlier, the atoms or molecules of a source material of the nitride semiconductor thin films migrate or otherwise move from the top growth portions 221 of the ridges 1 into the growth portions 225 or the trench growth portions 222. Where they have moved away, it takes more time to form the nitride semiconductor thin films, with the result that the nitride semiconductor thin films formed in the trenches 2 have larger thicknesses. By contrast, where the trenches 2 are filled later, the atoms or molecules of a source material of the nitride semiconductor thin films do not migrate or otherwise move from the top growth portions 221 of the ridges 1 into the trenches 2; even if they do, it takes less time to form the nitride semiconductor thin films. Thus, the nitride semiconductor thin films have smaller film thicknesses in these trenches 2 than where the trenches 2 are filled earlier.

In a state where the growth speed depends on the feed rate, that is, in a state where the growth speed of the nitride semiconductor thin films is controlled by the flux of the like of atoms or molecules fed to the wafer surface, when the atoms or molecules of a source material of the nitride semiconductor thin films migrate or otherwise move into the trenches 2, since the flux of the atoms or molecules of the source material fed to the entire wafer surface is constant, the film thicknesses in the top growth portions 221, where the nitride semiconductor thin films grow on the top portions 223 of the ridges 1, are smaller. By contrast, in a case where the atoms or molecules of a source material of the nitride semiconductor thin films do not migrate or otherwise move into the trenches 2, the film thicknesses in the top growth portions 221, where the nitride semiconductor thin films grow on the top portions 223 of the ridges 1, are larger.

Consequently, the layer thicknesses in the top growth portions 221 on the top portions 223 of the ridges 1 vary within the wafer surface, with the result that the flatness of the surface of the nitride semiconductor thin films is degraded. Thus, to obtain better surface flatness, it is necessary to hinder the atoms or molecules of a source material of the nitride semiconductor thin films from migrating or otherwise moving from the top growth portion 221 on the ridges 1 into the growth portions 225 or the trench growth portions 22 and thereby hinder them from forming nitride semiconductor thin films there.

Another way to obtain better flatness is to make the atoms or molecules of a source material of the nitride semiconductor thin films, when they migrate or otherwise move from the top growth portions 221 on the ridges 1 into the trench growth portions, move uniformly all over the wafer.

SUMMARY OF THE INVENTION

In view of the foregoing, an object of the present invention is to provide a nitride semiconductor device that does not develop cracks, that has highly uniform layer thicknesses, that has a nitride semiconductor multiple-layer film with a flat surface, that can be fabricated at a high yield, and that is free from current leakage. Another object of the present invention is to provide a fabrication method of such a nitride semiconductor device. Specifically, what is aimed at by the present invention is, in the fabrication of a nitride semiconductor device such as a nitride semiconductor laser device fabricated by laying a nitride semiconductor multiple-layer film on a substrate of which at least the surface is formed of a nitride semiconductor, to prevent development of cracks and, simultaneously, to form a nitride semiconductor multiple-layer film with good surface flatness by hindering the atoms or molecules of a source material of nitride semiconductor thin films from migrating or otherwise moving from top surface portions on the surface of ridges into trenches and thereby hindering them to form nitride semiconductor thin films there, or by making the atoms or molecules of a source material of nitride semiconductor thin films to migrate or otherwise move from top surface portions on the surface of ridges into trenches uniformly all over the wafer.

According to a convention in crystallography, if an index indicating a plane or direction of a crystal is negative, the index is expressed by the absolute value thereof with an overscore placed above it. In the present specification, since such notation is impossible, a negative index is expressed by the absolute value thereof with a minus sign "−" preceding it.

"Trenches" denote concave areas formed in the shape of stripes on the surface of a nitride semiconductor substrate as shown in FIG. 2. FIG. 2 is a schematic sectional view of a processed substrate 26 having trenches 22 and ridges 21 formed thereon by a trench forming process. The trenches 22 do not necessarily have to have a rectangular cross-sectional shape, but may have a triangular or trapezoid cross-sectional shape so long as they are so shaped as to produce a level difference. The trenches 2 do not necessarily have to be so formed that each of them consists of a single concave area, but may be so formed that each of them consists of a plurality of concave areas with a narrow flat portion or portions lying therebetween.

"Ridges" denote elevated portions formed likewise in the shape of stripes. FIG. 2 shows a stripe arrangement in which the trenches 22 and ridges 21 are formed in one direction. Alternatively, it is also possible to form the trenches 22 and ridges 21 in an lattice-shaped arrangement in which they are formed in two mutually crossing directions. It is also possible to form the trenches 22 with different shapes, different depths, or different widths on a single substrate. It is also possible to form the trenches 22 with varying periods on a single substrate.

A "processed substrate" denotes a substrate produced by forming trenches and ridges on a nitride semiconductor, or on the surface of a nitride semiconductor thin films laid on a nitride semiconductor substrate, or on a non-nitride-semiconductor substrate (such as a sapphire, SiC, Si, or GaAs substrate) having a nitride semiconductor layer on the surface.

A "nitride semiconductor substrate" denotes a substrate formed at least of $Al_xGa_yIn_zN$ ($0 \leq x \leq 1$, $0 \leq y \leq 1$, $0 \leq z \leq 1$, and $x+y+z=1$). In the nitride semiconductor substrate, about 20% or less of the nitrogen atoms contained therein may be replaced with at least one of the following group of elements: As, P and Sb. The nitride semiconductor substrate may be doped with an impurity such as an n-type or p-type dopant. Examples of such impurities include: Cl, O, S, Se, Te, C, Si, Ge, Zn, Cd, Mg, and Be. It is preferable that the total amount of impurities added be $5 \times 10^{16}/cm^3$ or more but $5 \times 10^{20}/cm^3$ or less. Among the just mentioned impurities, particularly preferable as one for giving the nitride semiconductor substrate n-type conductivity is Si, Ge, O, Se, or Cl. As the principal plane direction of the nitride semiconductor substrate, the C plane {0001} can be used.

A multiple-layer film of nitride semiconductors grown on a processed substrate is called a nitride semiconductor multiple-layer film. Here, the nitride semiconductor multiple-layer film is formed of $Al_xGa_yIn_zN$ ($0 \leq x \leq 1$, $0 \leq y \leq 1$, $0 \leq z \leq 1$, and $x+y+z=1$). In the nitride semiconductor multiple-layer film, about 20% or less of the nitrogen atoms contained therein may be replaced with at least one of the following group of elements: As, P and Sb. The nitride semiconductor multiple-layer film may be doped with an impurity such as an n-type or p-type dopant. Examples of such impurities include: Cl, O, S, Se, Te, C, Si, Ge, Zn, Cd, Mg, and Be. It is preferable that the total amount of impurities added be $5 \times 10^{16}/cm^3$ or more but $5 \times 10^{20}/cm^3$ or less. Among the just mentioned impurities, particularly preferable as one for giving the nitride semiconductor multiple-layer film n-type conductivity is Si, Ge, S, Se, or Te, and particularly preferable as one for giving it n-type conductivity is Mg, Cd, or Be.

Of the nitride semiconductor multiple-layer film, the nitride semiconductor layer that is laid first on the processed substrate is called the nitride semiconductor primer layer. The nitride semiconductor primer layer may be formed of, for example, GaN, AlGaN, AlInGaN, AlGaNP, or AlGaNAs.

An active layer refers collectively to any layer composed of a well layer or of one or more well layers and barrier layers. For example, an active layer having a single quantum well structure is composed of a single well layer, or of a barrier layer, a well layer, and a barrier layer. On the other hand, an active layer having a multiple quantum well structure is composed of a plurality of well layers and a plurality of barrier layers.

To achieve the above objects, according to one aspect of the present invention, a nitride semiconductor device is provided with: a processed substrate formed by forming, on the surface of a nitride semiconductor substrate of which at least the surface is formed of a nitride semiconductor, a trench as at least one concave area and a ridge portion as a non-trench; and a nitride semiconductor growth layer composed of a plurality of nitride semiconductor thin films laid on the processed substrate, the nitride semiconductor growth layer being laid with the principal plane direction aligned with the {0001} plane. Here, the off-angle, which is the angle between a first vector extending from a surface portion of the ridge in a direction normal thereto and a second vector extending parallel to the crystal direction <0001> when the first and second vectors are assumed to start at the same point, is 0.05° or more but 4° or less.

In the nitride semiconductor device described above, preferably, the off-angle of the processed substrate is composed of: a first off-angle, which is the angle between the second vector and a third vector obtained by projecting the second first vector onto a first plane formed by, of the mutually perpendicular crystal directions <0001>, <11-20>, and <1-100>, the crystal directions <0001> and <1-100> when the second and third vectors are assumed to start at a same point; and a second off-angle, which is the angle between the second vector and a fourth vector obtained by projecting the first vector onto a second plane formed by, of the mutually perpendicular crystal directions <0001>, <11-20>, and <1-100>, the crystal directions <0001> and <11-20> when the second and fourth vectors are assumed to start at a same point.

In the nitride semiconductor device described above, preferably, let the first off-angle be θa and the second off-angle be θb, then |θa|≧|θb|.

In the nitride semiconductor device described above, preferably, $0.09° \leq |θa|°$.

In the nitride semiconductor device described above, preferably, $3 \times |θb|° < |θa|° < 0.09$ and simultaneously $0.05 \leq |θa|°$.

In the nitride semiconductor device described above, preferably, let the first off-angle be θa and the second off-angle be θb, then |θa|≦|θb|°.

In the nitride semiconductor device described above, preferably, $0.2° \leq |θb|°$.

In the nitride semiconductor device described above, preferably, the concave area formed as the trench extends in the form of a stripe, and the direction in which the concave area extends is parallel or substantially parallel to the crystal direction <1-100>.

In the nitride semiconductor device described above, the concave area formed as the trench extends in the form of a stripe, and the direction in which the concave area extends is parallel or substantially parallel to the crystal direction <11-20>.

In the nitride semiconductor device described above, preferably, the concave area formed as the trench is formed in the form of a lattice, and, of two mutually perpendicular directions in which the lattice extends, one is parallel or substantially parallel to the crystal direction <11-20> and the other is parallel or substantially parallel to the crystal direction <1-100>.

In the nitride semiconductor device described above, preferably, let the first off-angle be θa and the second off-angle be θb, the direction parallel to the longer sides of the ridge is parallel or substantially parallel to the crystal direction <1-100>, and |θa|≧|θb|.

In the nitride semiconductor device described above, preferably, let the first off-angle be θa and the second off-angle be θb, the direction parallel to the longer sides of the ridge is parallel or substantially parallel to the crystal direction <11-20>, and |θa|≦|θb|.

In the nitride semiconductor device described above, preferably, the square root of the sum of the square of the first off-angle and the square of the second off-angle is 0.2° or more.

In the nitride semiconductor device described above, preferably, the width of the ridge lying between two adjacent parts of the trench is 100 μm or more but 2 000 μm or less.

In the nitride semiconductor device described above, preferably, the nitride semiconductor thin film that makes contact with the surface of the processed substrate is GaN or AlGaN having a thickness of 0.5 μm or less.

In the nitride semiconductor device described above, preferably, the depth of the concave area formed as the trench is 1.5 μm or more.

In the nitride semiconductor device described above, preferably, let the total thickness of the nitride semiconductor growth layer formed on the ridge be T, then the depth of the concave area formed as the trench is T/2 or more.

In the nitride semiconductor device described above, preferably, the opening with of the concave area formed as the trench is 3 μm or more.

In the nitride semiconductor device described above, preferably, when the nitride semiconductor growth layer composed of the plurality of nitride semiconductor thin films is formed, at least one of the nitride semiconductor thin films is grown under the conditions that the surface temperature of the processed substrate is 1 050° C. or less and that the ratio of the flow rate in moles per unit time at which a source material containing a group V atom is supplied to the flow rate in moles per unit time at which a source material containing a group III atom is supplied is 2 250 or more.

According to the present invention described above, when a nitride semiconductor device such as a nitride semiconductor laser device is fabricated by laying a nitride semiconductor growth layer on a substrate of which at least the surface is formed of a nitride semiconductor, development of cracks is prevented, and in addition the atoms or molecules of a source material of nitride semiconductor thin films are hindered from migrating or otherwise diffusing or moving from top growth portions on the surface of ridges into trenches and are thereby hindered from forming nitride semiconductor thin films there. In this way, it is possible to form a nitride semiconductor growth layer with good surface flatness, and thereby obtain a nitride semiconductor device with satisfactory characteristics.

Alternatively, according to the present invention described above, the atoms or molecules of a source material of nitride semiconductor thin films are intentionally promoted to migrate or otherwise diffuse or move from top growth portions on the surface of ridges into trenches so that the atoms or molecules of the source material of the nitride semiconductor thin films diffuse or move uniformly all over the wafer. In this way, it is possible to form a nitride semiconductor growth layer with good surface flatness, and thereby obtain a nitride semiconductor device with satisfactory characteristics.

To achieve the above objects, according to another aspect of the present invention, the nitride semiconductor primer layer that is formed first on a processed substrate having trenches formed thereon is formed of a compound containing GaN.

With this structure, development of cracks is prevented, the nitride semiconductor multiple-layer film formed later has highly uniform layer thicknesses, and a flat surface is obtained.

Here, preferably, the layer thickness of the nitride semiconductor primer layer is 0.5 μm or less. Preferably, the ratio of the layer thickness of the nitride semiconductor primer layer to the total layer thickness of the nitride semiconductor multiple-layer film is 15% of less. Preferably, the angle between a line normal to a top-end portion of a side wall surface of the trench and a line normal to a surface elsewhere than in the trench is 60° or larger. Preferably, the width of the trench is 1 μm or more, and the period of the trench is 0.1 mm or more but 4 mm or less.

In a case where the above-mentioned nitride semiconductor primer layer is formed of a compound containing GaN, when the total layer thickness of the nitride semiconductor multiple-layer film is 4 μm or less, preferably, the depth of the trench is 1 μm or more but 20 μm or less, and the width of the trench is 1 μm or more.

In this way, it is possible to obtain acceptable surface roughness (300 Å or less), and thus obtain a device that offers consistent characteristics combined with a long lifetime.

According to the present invention described above, by producing a processed substrate having trenches formed thereon, and then laying a nitride semiconductor primer layer first on the processed substrate, it is possible to prevent development of cracks, and simultaneously obtain highly uniform layer thicknesses within the substrate surface combined with good surface flatness. Thus, it is possible to increase the number of devices with characteristics that meet the requirements for non-defectiveness and thereby increase the yield.

BRIEF DESCRIPTION OF THE DRAWINGS

FIG. 11 is a diagram schematically showing the nitride semiconductor laser device of Examples 1 to 4 of the invention;

FIG. 12A is a perspective view schematically showing a portion around trenches of a processed substrate having a nitride semiconductor multiple-layer film laid thereon, and FIG. 12B is a sectional view along line A-A shown in FIG. 12A;

FIG. 13A is a front view of a nitride semiconductor device, and FIG. 13B is a top view of FIG. 13A;

FIG. 19 is a diagram schematically showing a wafer having a nitride semiconductor growth layer laid on a conventional processed substrate;

FIG. 22 is a diagram illustrating a model of how, conventionally, degraded flatness occurs.

DETAILED DESCRIPTION OF PREFERRED EMBODIMENTS

First Embodiment

Figure 1:
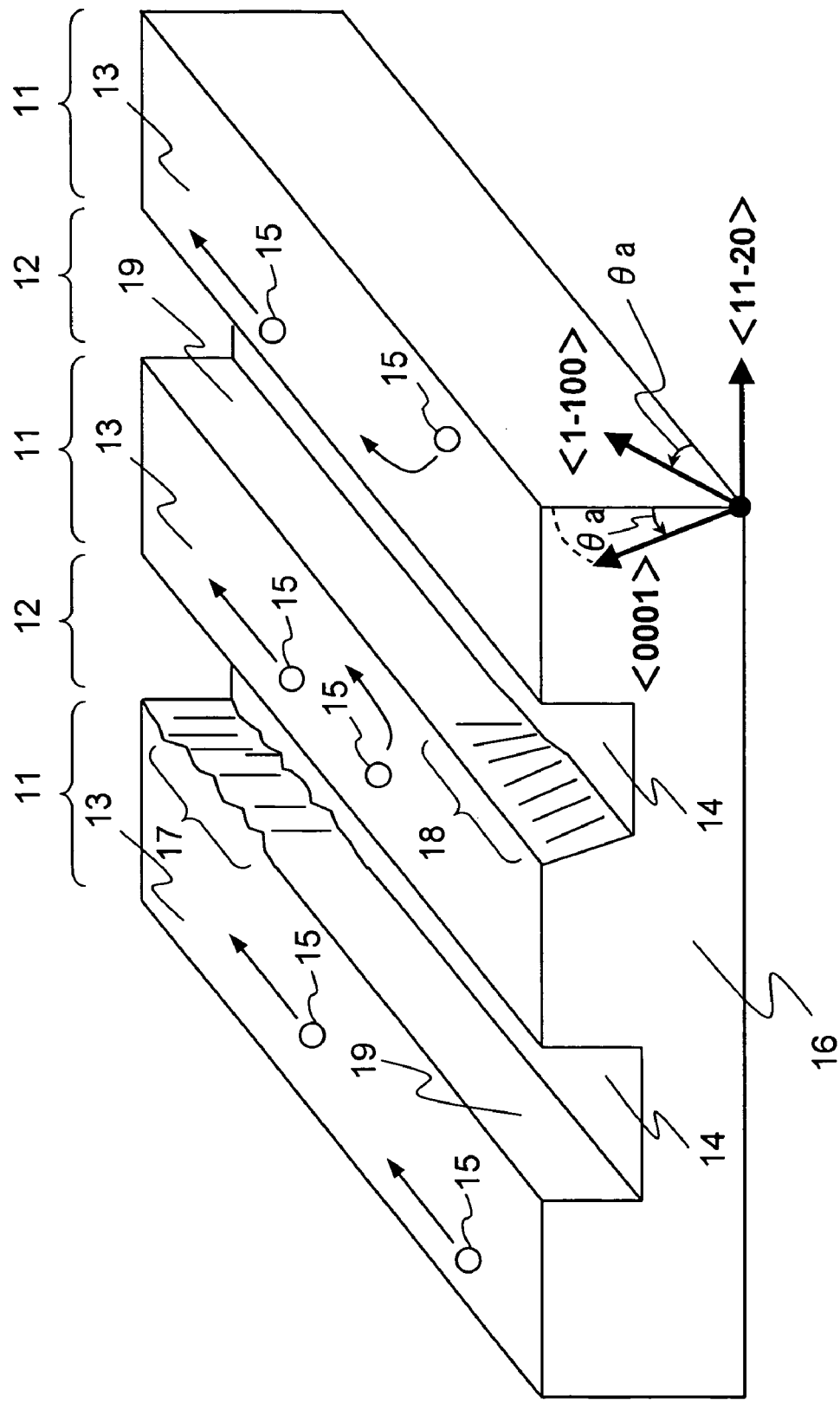
FIG. 1 is a diagram schematically showing a processed substrate having an off-angle of θa° used in a first embodiment of the invention.
Figure 2:
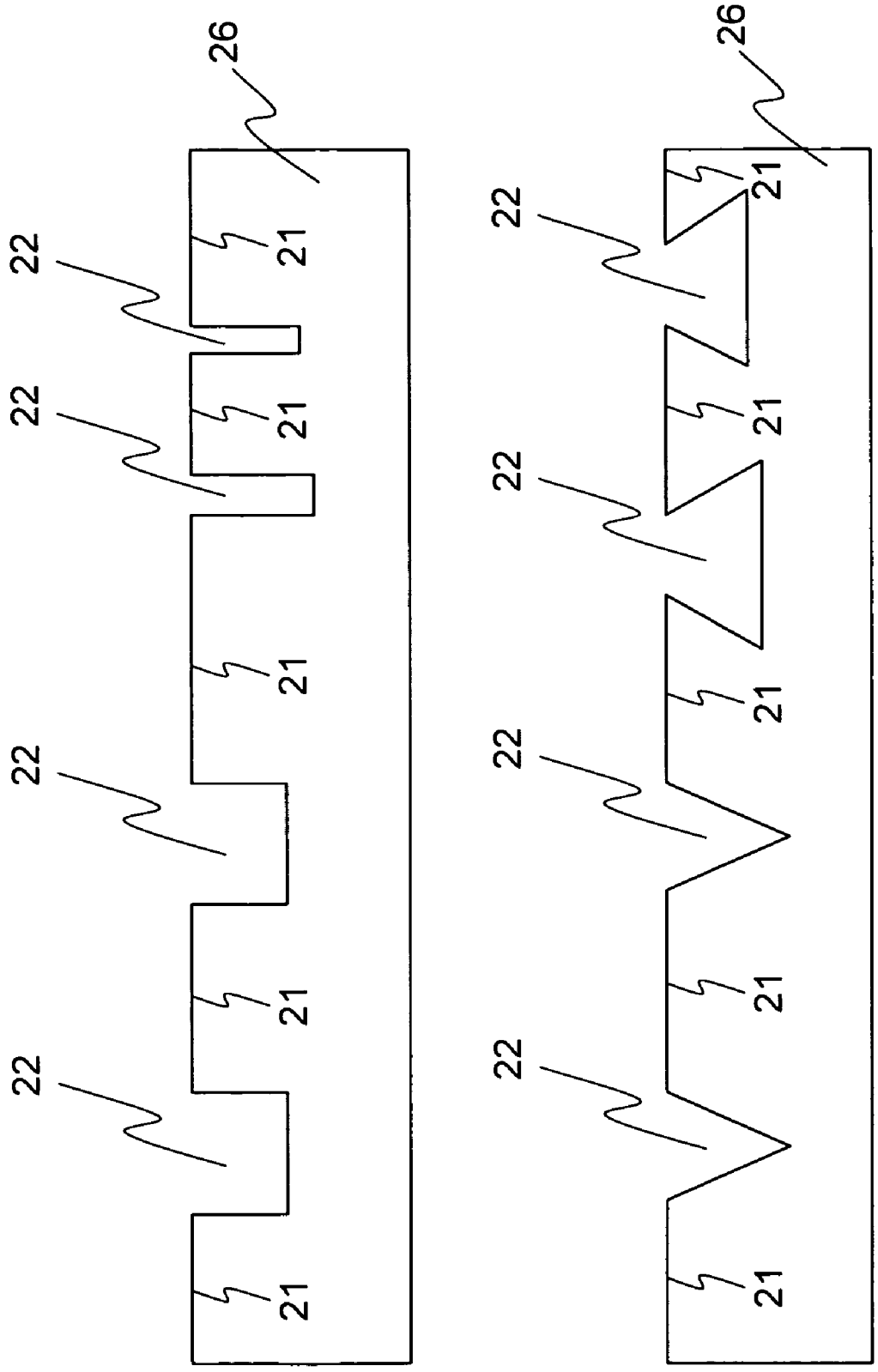
FIG. 2 is a sectional view schematically showing processed substrates having variously shaped trenches formed thereon.
Figure 3:
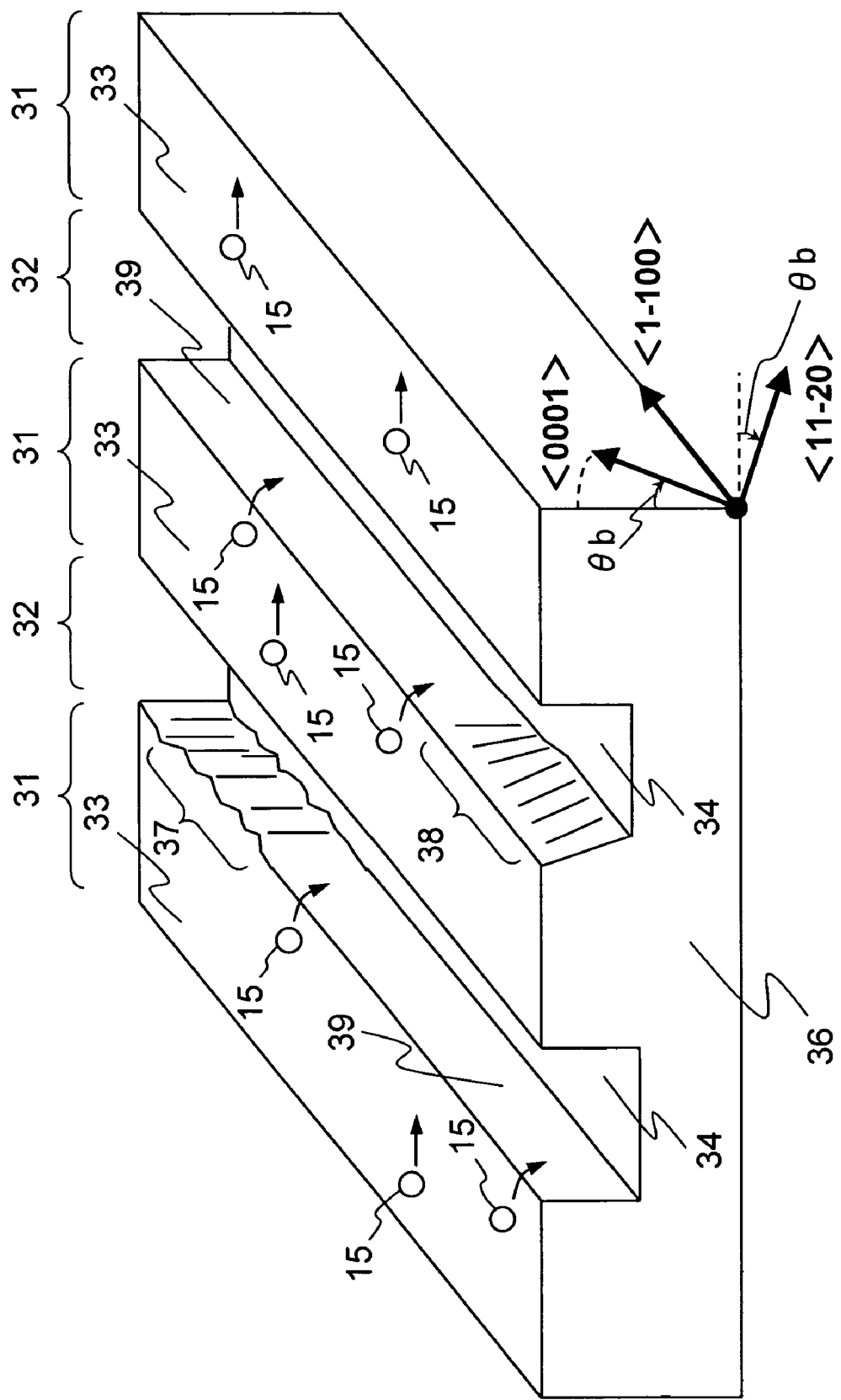
FIG. 3 is a diagram schematically showing a processed substrate having an off-angle of θb° used in the first embodiment of the invention.
Figure 4:
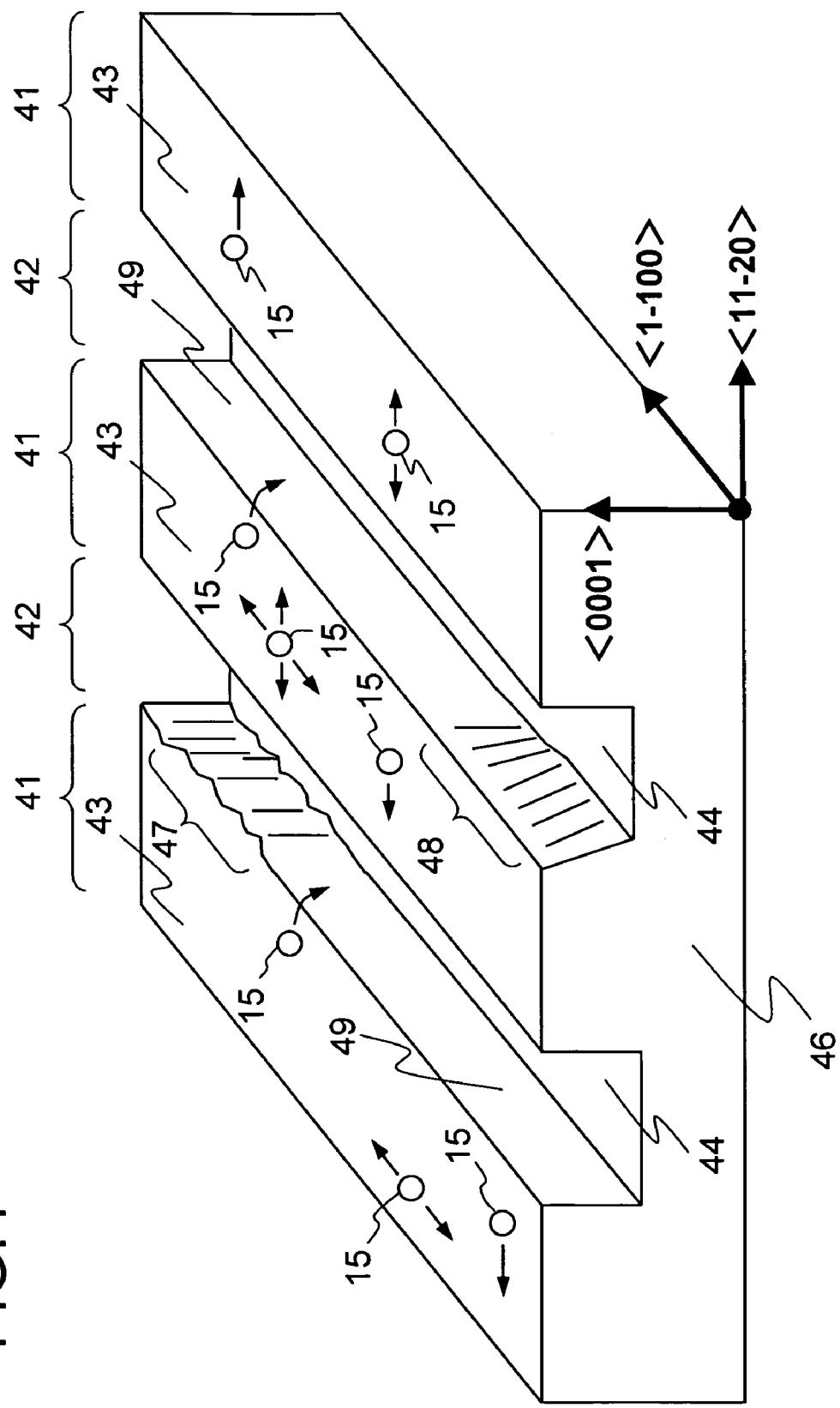
FIG. 4 is a diagram schematically showing a processed substrate having no off-angle.

A first embodiment of the present invention will be described below with reference to the relevant drawings. The following description of embodiments deals with a nitride semiconductor layer as an example of a nitride semiconductor device, but it should be understood that the present invention can be applied to any other type of nitride semiconductor device. FIGS. 1 and 3 are diagrams schematically showing the processed substrates 16 and 36 used in this embodiment, as observed when a nitride semiconductor multiple-layer film 4 is grown thereon. As shown in FIGS. 1 and 3, the processed substrates 16 and 36 each have a fixed off-angle. FIG. 4 is a diagram schematically showing a processed substrate 46 produced from a commonly used substrate having an off-angle of 0.02° or less. In FIGS. 1, 3, and 4, the plane directions are indicated together. In this embodiment, a nitride semiconductor laser device is fabricated by growing a nitride semiconductor multiple-layer film 4 on a processed substrate having an off-angle like the processed substrates 16 and 36.

First, a description will be given of how a processed substrate 46 is produced from a substrate having an off-angle of 0.02° or less, that is, almost zero degrees, as shown in FIG. 4. In this embodiment, GaN substrates are assumed to be used as the processed substrates 16, 36, and 46.

First, over the entire surface of an n-type GaN substrate, by sputtering, $SiO_2$ or the like is vapor-deposited to have a film thickness of 1 µm. Subsequently, by a common photolithography process, a resist pattern in the shape of stripes is formed in the <1-100> direction so that the resist openings have a width of 5 µm and the stripes lie at intervals (hereinafter the "period") of 350 µm as measured from the centerline of one stripe to that of the next in the direction parallel to the <11-20> direction. Next, by a dry etching technique such as RIE (reactive ion etching), the $SiO_2$ film and the n-type GaN substrate are etched to form trenches 42 with a trench depth of 5 µm and an opening width of 5 µm. Then, by using an etchant such as HF (hydrogen fluoride), the $SiO_2$ is removed. In this way, a processed substrate 46 having trenches 42 and ridges 41 formed thereon is produced.

In this embodiment, $SiO_2$ is vapor-deposited to form a $SiO_2$ film on the surface of a GaN substrate. Instead, a film of another dielectric material or the like may be formed on the surface of the GaN substrate. The above-mentioned $SiO_2$ film may be formed otherwise than by sputtering vapor deposition; for example, it may be formed by a method such as electron beam vapor deposition or plasma CVD. The period of the resist pattern is not limited to 350 µm specifically mentioned above, but may be varied according to the width of the nitride semiconductor laser device to be fabricated. In this embodiment, trenches 42 are formed by a dry etching technique; it is however also possible to form them by a wet etching technique or the like.

The processed substrate 46 may be produced by forming trenches 42 directly on the surface of an n-type GaN substrate as described above, or may be formed by first growing a nitride semiconductor thin film of GaN, InGaN, AlGaN, InAlGaN, or the like on an n-type GaN substrate or on a nitride semiconductor substrate other than an n-type nitride semiconductor substrate and then forming trenches thereon.

The processed substrates 16 and 36 are formed basically in the same manner as the processed substrate 46. The differences are as follows. The substrate used to produce the processed substrate 16 has both the crystal directions <1-100> and <0001> rotated or inclined by θa° about the direction of the crystal direction <11-20> as an axis of rotation, and thus has an off-angle of θa between the crystal direction <0001> and the direction normal to the growth surface on the substrate. On the other hand, the substrate used to produce the processed substrate 36 has both the crystal directions <11-20> and <0001> rotated or inclined by θb° about the direction of the crystal direction <1-100> as an axis of rotation, and thus has an off-angle of θb between the crystal direction <0001> and the direction normal to the growth surface on the substrate. On each of these substrates having off-angles of θa and θb respectively, trenches 12 and 32 and ridges 11 and 31 are formed in the same manner as described above. Here, photoresist pattern formation, etching, and other processes are performed assuming that each substrate has an off-angle of zero.

The off-angle may be inclined not only in one direction, such as by θa° or θb° alone as described above, but in different directions by different degrees simultaneously (by both θa° and θb°). Specifically, suppose that, about the <11-20> direction as an axis of rotation, the crystal directions <1-100> and <0001> are both rotated or inclined by θa° so that there is an off-angle of θa between the crystal direction <0001> and the direction normal to the growth surface on the substrate. Then, let a displacement vector A be the vector starting at the displacement vector of the unit vector (with a length of 1) in the crystal direction <0001> before rotation and ending at the unit vector in the crystal direction <0001> after rotation. Moreover, suppose that, about the <1-100> direction as an axis of rotation, the crystal directions <11-20> and <0001> are both rotated or inclined by θb° so that there is an off-angle of θb between the crystal direction <0001> and the direction normal to the growth surface on the substrate. Then, let a displacement vector B be the vector starting at the displacement vector of the unit vector in the crystal direction <0001> before rotation and ending at the unit vector in the crystal direction <0001> after rotation. Then, let a displacement vector C be the sum of the displacement vectors A and B, and let a composite vector D be the sum of the unit vector in the crystal direction <0001> before rotation and the displacement vector C. Then, the direction of the end point of this composite vector D may be the direction in which the off-angle is inclined. In the present specification, in a case where the substrate has an off-angle as a result of the crystal direction <0001> being inclined by the displacement vector C, it is indicated by stating both the off-angles θa and θb mentioned above.

Determining the Off-Angle

As part of the description of this embodiment, first, with reference to the relevant drawings, a description will be given of how the off-angle of the substrate affects the growth of the nitride semiconductor thin films laid on the processed substrate having trenches and ridges formed thereon.

As shown in FIG. 4, when the processed substrate 46 having an off-angle of 0.02° or less, that is, almost zero degrees, is used, the direction normal to top portions 43 of the ridges 41 and to floor portions 44 of the trenches 42 is parallel to the crystal direction <0001>. Moreover, three axes aligned to the crystal directions <0001>, <1-100>, and <11-20> respectively are perpendicular to one another. In this case, the atoms or molecules 15 of a material of nitride semiconductor thin films that have deposited on the top portions 43 of the ridges 41 do not diffuse in a particular direction with a high probability, but diffuse isotropically from the spots on which they have deposited. As a result, the atoms or molecules 15 of the material of nitride semiconductor thin films migrate or otherwise diffuse isotropically, and part of them move into the trenches 42 and form nitride semiconductor thin films.

Usually, when the trenches 12, 32, and 42 are formed, they are not formed perfectly uniformly all over the wafer, but process-attributable fluctuations occur in the photolithography process for forming the photoresist pattern and in the etching process for performing dry etching or the like. As a result, fluctuating-boundary portions 17, 37, and 47 that are not straight may be formed at the boundaries between the trenches 12, 32, and 42 and the ridges 11, 31, and 41, and fluctuating-squareness portions 18, 38, and 48 may be formed where the angle between side portions 19, 39, and 49 and floor portions 14, 34, and 44 of the trenches 12, 32, and 42 is not perpendicular.

When the trenches 12, 32, and 42 and the ridges 11, 31, and 41 are not formed uniformly all over the wafer because of process-attributable fluctuations as described above, the degree in which the atoms or molecules 15 of a source material of nitride semiconductor thin films that have deposited on the top portions 13, 33, and 43 of the ridges 11, 31, and 41 migrate or otherwise diffuse or move into the trenches 12, 32, and 42 is not uniform over the wafer but differ from one region to another. That is, in some regions on the wafer, the atoms or molecules 15 of a source material of nitride semiconductor thin films that have deposited on the top portions 13, 33, and 43 of the ridges 11, 31, and 41 are more likely to migrate or otherwise diffuse or move into the trenches 12, 32, and 42, and, in other regions on the wafer, the atoms or molecules 15 of a source material of nitride semiconductor thin films that have deposited on the top portions 13, 33, and 43 of the ridges 11, 31, and 41 are less likely to migrate or otherwise diffuse or move into the trenches 12, 32, and 42.

As described above, if the degree in which the atoms or molecules 15 of a source material of nitride semiconductor thin films that have deposited on the top portions 13, 33, and 43 of the ridges 11, 31, and 41 migrate or otherwise diffuse or move into the trenches 12, 32, and 42 is not uniform over the wafer, it affects the flatness of the nitride semiconductor thin films grown on the ridges 11, 31, and 41, with the result that the film thicknesses of the nitride semiconductor thin films grown on the ridges 11, 31, and 41 vary over the wafer, exhibiting different values from one region to another.

Figure 5:
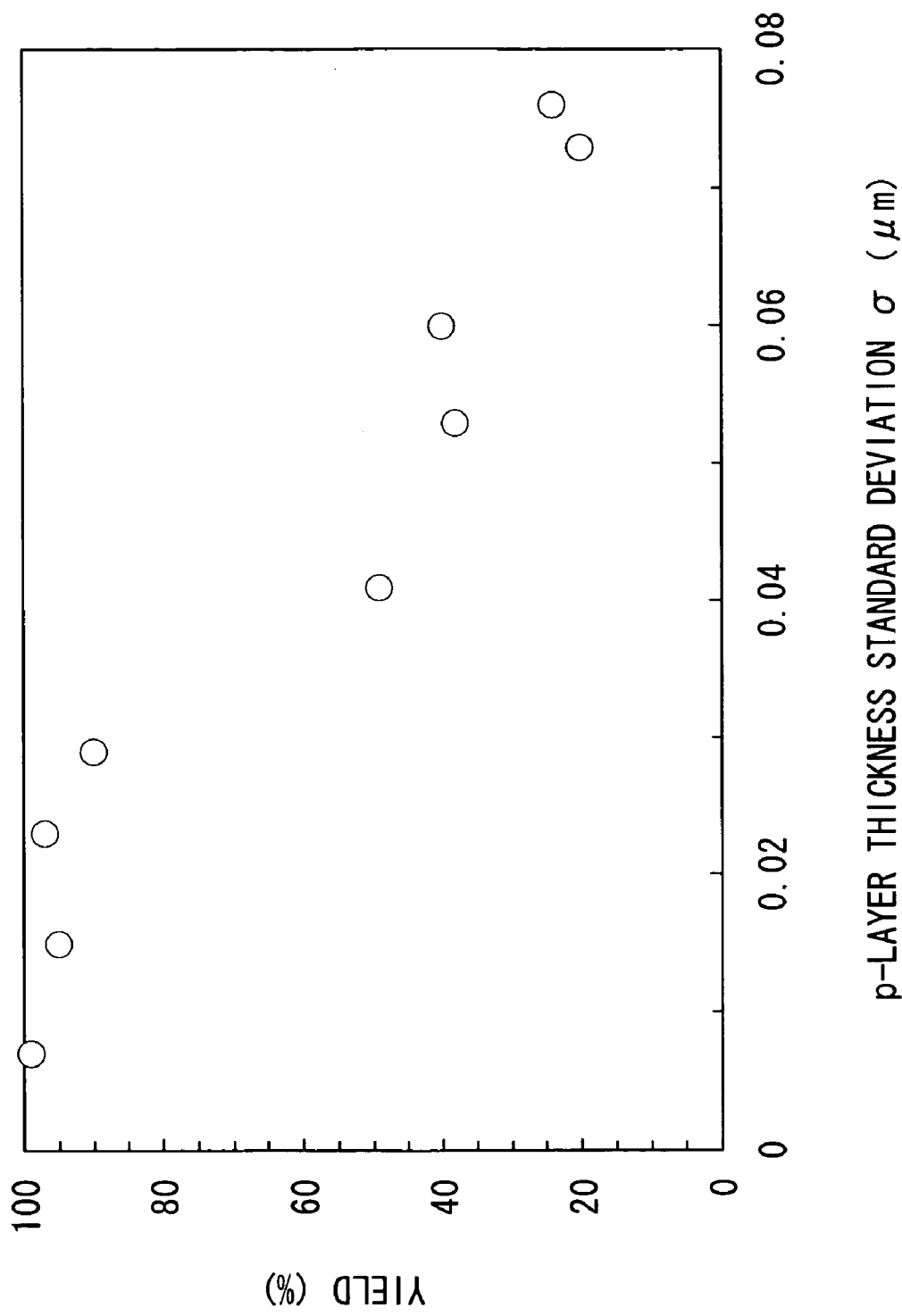
FIG. 5 is a diagram showing the correlation between the standard deviation σ of the p-layer thickness and the yield.

If the thicknesses of the nitride semiconductor thin films grown on the ridges 11, 31, and 41 vary in this way, it adversely affects the yield of the nitride semiconductor laser devices when they are formed on the ridges 11, 31, and 41. FIG. 5 shows the relationship between the standard deviation σ indicating the degree of variation of the p-layer thickness above the ridges (corresponding to the sum of the thicknesses of the p-layers laid on one another as the p-type $Al_{0.03}Ga_{0.7}N$ evaporation prevention layer 206 to the p-type GaN contact layer 209 shown in FIG. 20) and the yield. The graph in FIG. 5 shows that, when the standard deviation σ of the p-layer thickness is 0.03 μm or less, a very high yield of 90% or more is achieved but that, when standard deviation σ of the p-layer thickness is 0.03 μm or more, the yield lowers sharply.

The reason that the yield lowers sharply when the standard deviation σ of the p-layer thickness is 0.03 μm or more as described above is that, if the layer thicknesses of the p-type GaN guide layer 207, the p-type $Al_{0.05}Ga_{0.95}N$ clad layer 208, and the like vary too greatly, when nitride semiconductor laser device structures are fabricated, their electrical and optical characteristics vary. Moreover, if nitride semiconductor laser devices are fabricated in regions where the p-layer thickness exhibits a large standard deviation σ, current leakage occurs during energization. This also contributes to the low yield.

As discussed above, when nitride semiconductor laser devices are fabricated, to achieve a higher yield, it is necessary to improve the flatness, including the p-layer thickness, of the nitride semiconductor thin films grown on ridges, which are the regions where nitride semiconductor laser devices will be fabricated. For this purpose, the inventors of the present invention invented the following two method: a method whereby the atoms or molecules 15 of a source material of nitride semiconductor thin films are hindered from migrating or otherwise diffusing or moving into trenches; and a method whereby the atoms or molecules 15 of a source material of nitride semiconductor thin films are intentionally promoted to migrate or otherwise diffuse or move into trenches.

Of the two methods mentioned above, the one whereby the atoms or molecules 15 of a source material of nitride semiconductor thin films are hindered from migrating or otherwise diffusing or moving into trenches involves producing a processed substrate 16 by the use of a substrate in which the crystal directions <0001> and <1-100> are both rotated or inclined by θa° about the crystal direction <11-20> as an axis of rotation as shown in FIG. 1, that is, a substrate in which the crystal direction <0001> after rotation has an off-angle of θa relative to the crystal direction <0001> before rotation, and then growing nitride semiconductor thin films thereon. It has been found that, when nitride semiconductor thin films are grown on such a processed substrate 16, the atoms or molecules 15 of a source material of nitride semiconductor thin films that have deposited on the top portions 13 of the ridges 11 more notably migrate or otherwise diffuse or move in a direction substantially parallel to the <1-100> direction, that is, in the direction parallel to the direction in which the trenches 2 extend, than in the <11-20> direction. Consequently, the atoms or molecules 15 of a source material of nitride semiconductor thin films that have deposited on the top portions 13 of the ridges 11 are hindered from migrating or otherwise diffusing or moving into the trenches 12. Thus, on the top portions 13 of the ridges 11, nitride semiconductor thin films are formed with good surface flatness.

On the other hand, of the two methods mentioned above, the one whereby the atoms or molecules 15 of a source material of nitride semiconductor thin films are intentionally promoted to migrate or otherwise diffuse or move into trenches involves producing a processed substrate 16 by the use of a substrate in which the crystal directions <0001> and <11-20> are both rotated or inclined by θb° about the crystal direction <1-100> as an axis of rotation as shown in FIG. 3, that is, a substrate in which the crystal direction <0001> after rotation has an off-angle of θb relative to the crystal direction <0001> before rotation, and then growing nitride semiconductor thin films thereon. It has been found that, when nitride semiconductor thin films are grown on such a processed substrate 36, the atoms or molecules 15 of a source material of nitride semiconductor thin films that have deposited on the top portions 33 of the ridges 31 more notably migrate or otherwise diffuse or move in a direction substantially parallel to the <11-20> direction, that is, in a direction perpendicular to the direction in which the trenches extend and parallel to the surface of the top portions 33 of the ridges 31, than in the <1-100> direction. Consequently, the atoms or molecules 15 of a source material of nitride semiconductor thin films that have deposited on the top portions 13 of the ridges 11 are greatly promoted to migrate or otherwise diffuse or move into the trenches 12. Thus, regardless of the presence of fluctuating-boundary portions 37 and fluctuating-squareness portions 38, the atoms or molecules 15 of a source material of nitride semiconductor thin films that have deposited on the top portions 33 of the ridges 31 migrate or otherwise diffuse or move into the trenches 32 uniformly all over the wafer. Thus, on the top portions 13 of the ridges 11, nitride semiconductor thin films are formed with good surface flatness.

It is generally known that nitride semiconductor thin films such as GaN-based semiconductor thin films grow faster in the <11-20> direction than in the <1-100> direction. For this reason, when a processed substrate 16 is produced by the use of a substrate in which the crystal directions <0001> and <1-100> are both rotated by θa° about the crystal direction <11-20> as an axis of rotation and then nitride semiconductor thin films are grown on this processed substrate 16, the above-mentioned value θa needs to be sufficiently large to promote the atoms or molecules 15 of a source material of nitride semiconductor thin films that have deposited on the top portions 13 of the ridges 11 to migrate or otherwise diffuse or move in the direction substantially parallel to the <1-100> direction, that is, in this direction in which the trenches 12 extend, and to hinder the atoms or molecules 15 of a source material of nitride semiconductor thin films that have deposited on the top portions 13 of the ridges 11 from migrating or otherwise diffusing or moving in the direction parallel to the <11-20> direction, that is, in the direction perpendicular to the direction in which the trenches 2 extend and thus into the trenches 12.

Figure 6:
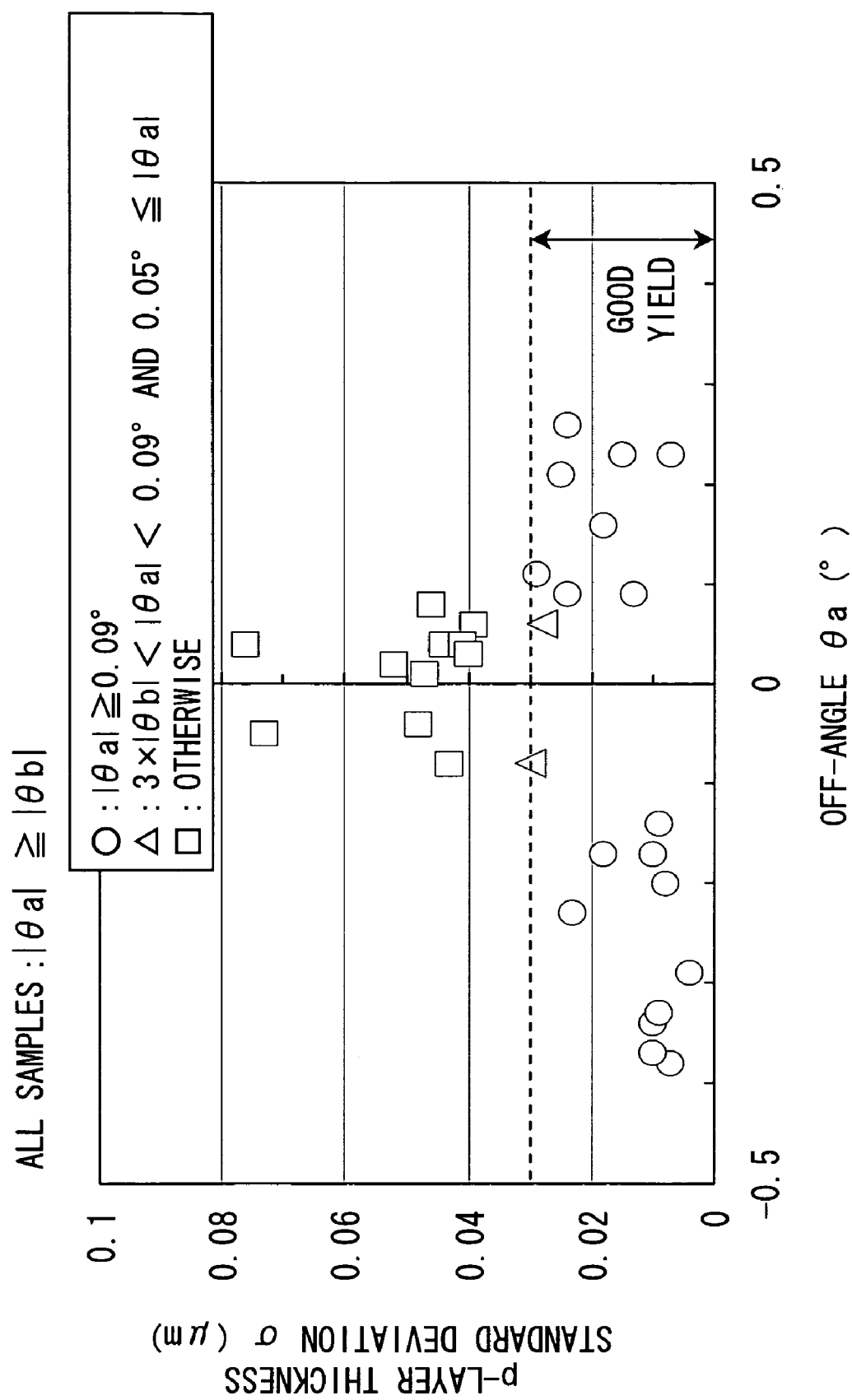
FIG. 6 is a diagram showing the correlation between the off-angle θa and the standard deviation σ of the p-layer thickness.
Figure 7:
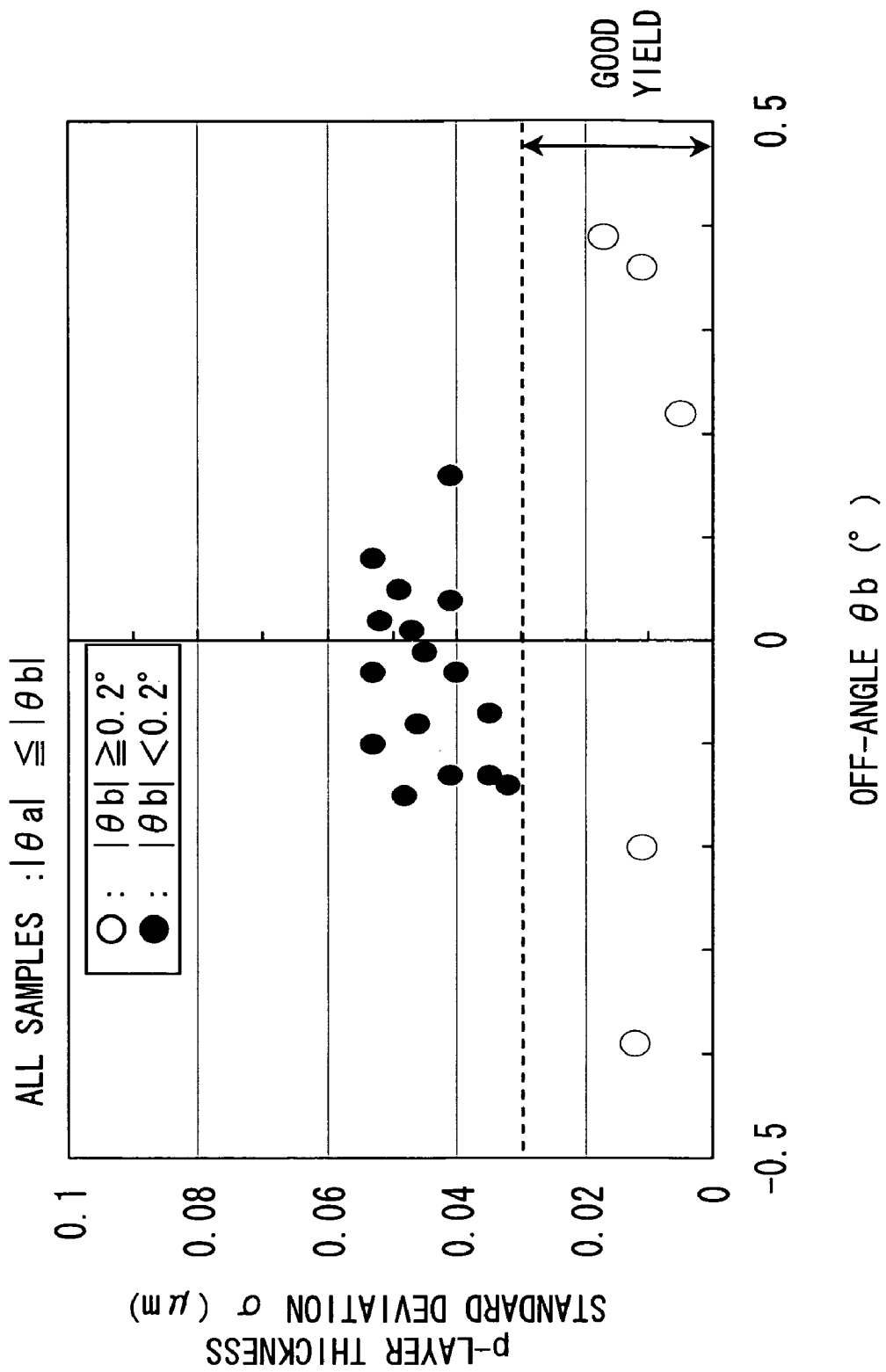
FIG. 7 is a diagram showing the correlation between the off-angle θb and the standard deviation σ of the p-layer thickness.

The relationship between the above-mentioned off-angles θa and θb and the standard deviation σ of the p-layer thickness is shown in FIGS. 6 and 7. FIG. 6 shows the relationship between the off-angle θa and the standard deviation σ of the p-layer thickness above the ridges as measured when nitride semiconductor laser devices are fabricated by the use of a processed substrate in which the absolute value of the off-angle θa is larger than or equal to the absolute value of the off-angle θb. FIG. 7 shows the relationship between the off-angle θb and the standard deviation σ of the p-layer thickness above the ridges as measured when nitride semiconductor laser devices are fabricated by the use of a processed substrate in which the absolute value of the off-angle θa is smaller than or equal to the absolute value of the off-angle θb. The sign (+ or −) along the horizontal axis in FIGS. 6 and 7 is determined by arbitrarily regarding one of the directions across the actually used wafer as positive; thus, in crystallographic terms, the signs + and − are equivalent, and only the absolute values of the off-angles θa and θb matter.

FIG. 6 shows the following. In a case where a processed substrate in which the absolute value of the off-angle θa is larger than or equal to the absolute value of the off-angle θb is used, when the absolute value of the off-angle θa is 0.09° or more, the standard deviation σ of the p-layer thickness is 0.03 μm or less, and thus nitride semiconductor laser devices can be fabricated at a high yield (see FIG. 5). Even when the absolute value of the off-angle θa is smaller than 0.09°, so long as the absolute value of the off-angle θa is larger than three times the absolute of the off-angle θb and in addition the absolute value of the off-angle θa is larger than 0.05°, the standard deviation σ of the p-layer thickness is 0.03 μm or less. Otherwise, the standard deviation σ of the p-layer thickness is larger than 0.03 μm; thus, it is impossible to obtain good surface flatness on the growth surface, and therefore it is impossible to achieve a high yield.

FIG. 7 shows the following. In a case where a processed substrate in which the absolute value of the off-angle θa is smaller than or equal to the absolute value of the off-angle θb is used, when the absolute value of the off-angle θb is 0.2° or more, the standard deviation σ of the p-layer thickness is 0.03 μm or less, and, when the absolute value of the off-angle θb is smaller than 0.2°, the standard deviation σ of the p-layer thickness is larger than 0.03 μm. That is, when the absolute value of the off-angle θb is 0.2° or more, good surface flatness can be obtained on the growth surface, and nitride semiconductor laser devices can be fabricated at a high yield.

Figure 8:
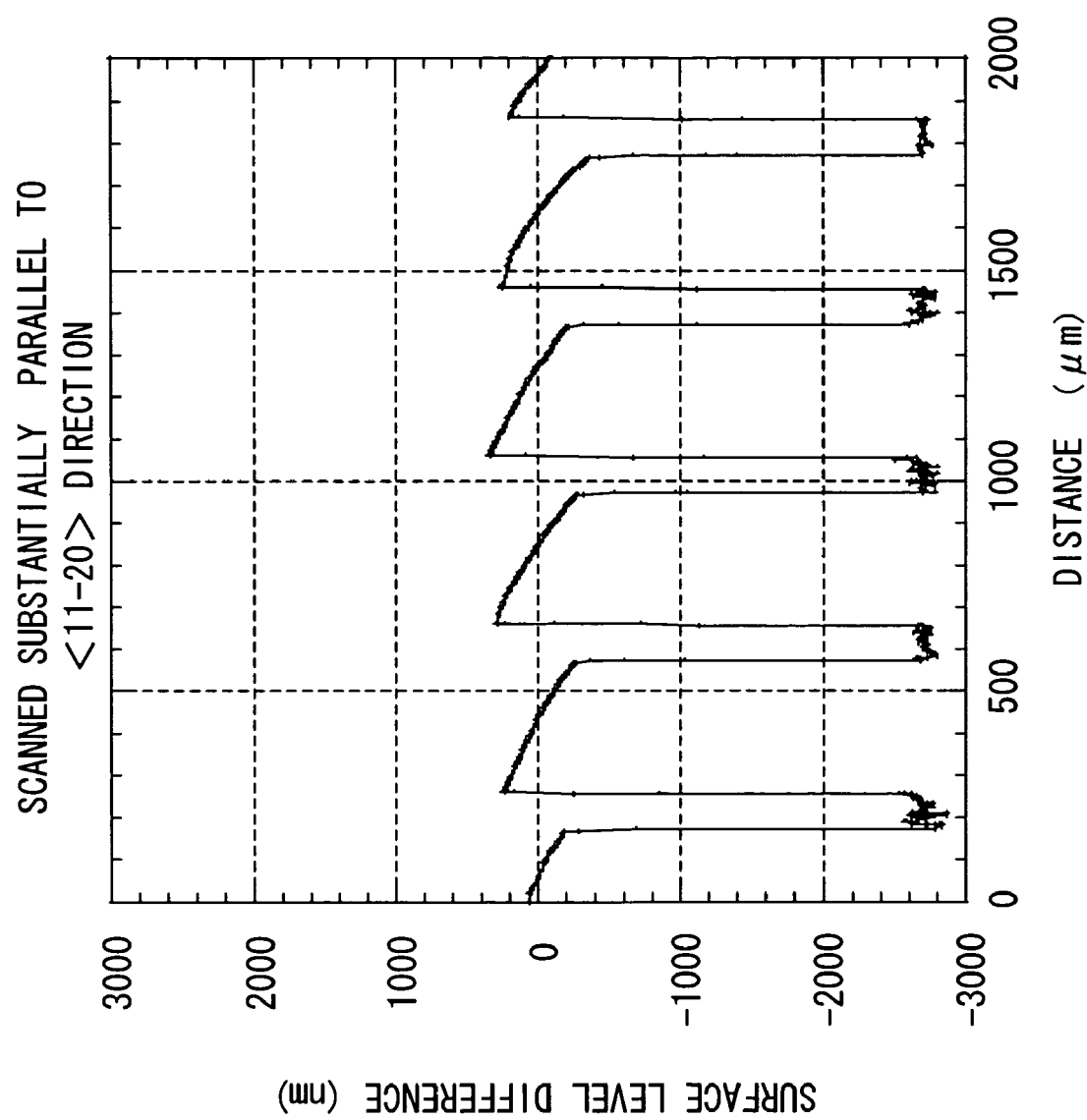
FIG. 8 is a plotting of level variation on the surface of a wafer having a nitride semiconductor growth layer laid on a processed substrate having an off-angle of θb° used in the first embodiment of the invention.

In this method of obtaining good surface flatness by giving the off-angle θb a large absolute value, a processed substrate 36 in which the crystal directions <0001> and <11-20> are both rotated or inclined by θb° about the crystal direction <1-100> as an axis of rotation is used, and thus the crystal direction <0001> is inclined by θb° relative to the direction normal to the top portions 33 of the ridges 31. Thus, the atoms or molecules 15 migrate or otherwise diffuse or move into the trenches 32 in one direction. Thus, as shown in FIG. 8, the surface of the nitride semiconductor thin films grown on the processed substrate 36 is inclined. FIG. 8 shows the result of a scan, with a surface level difference tester, across the surface of the nitride semiconductor thin films grown on the processed substrate 36 in the direction (substantially parallel to the <11-20> direction) perpendicular to the direction in which the trenches 32 extend. FIG. 8 shows that the surface of the nitride semiconductor thin films formed on the top portions 33 of the ridges 31 is inclined in the direction in which the crystal directions are inclined. However, the height of central portions of the ridges 31, which are elevated portions on which the ridge portions of nitride semiconductor laser devices are formed, is substantially uniform, and the p-layer thickness is also uniform. Thus, these cause no problem in the fabrication of nitride semiconductor laser devices. Incidentally, in a case where a processed substrate 16 in which the crystal directions <0001> and <1-100> are both rotated or inclined by θa° about the crystal direction <11-20> as an axis of rotating is used, the atoms or molecules 15 of a source material of nitride semiconductor thin films are hindered from moving or diffusing into the trenches 12, and thus, when nitride semiconductor thin films are grown on the processed substrate 16 as described above, the surface of the nitride semiconductor thin films formed on the top portions 13 of the ridges 11 is not inclined, but the surface is flat. Thus, it is more preferable to use a substrate 16 in which the crystal directions <0001> and <1-100> are both rotated or inclined by θa° about the crystal direction <11-20> as an axis of rotation.

In a case where the crystal directions of the substrate are displaced by the displacement vector C mentioned earlier, that is, in a case where the crystal directions of the substrate are inclined by both the off-angles θa and θb, when the square root of the sum of the square of the off-angle θa and the square of the off-angle θb is 0.2° or more, the nitride semiconductor thin films grown on the processed substrate has good surface flatness.

The description above deals with cases where the trenches 12, 32, or 42 extend in the direction parallel or substantially parallel to the <1-100> direction, but similar advantages can be obtained also in cases where the trenches 12, 32, or 42 extend in the direction parallel or substantially parallel to the <11-20> direction. Even in cases where concave areas are formed not only in the direction parallel or substantially parallel to the <1-100> direction, like the trenches 12, 32, or 42, but also in the direction parallel or substantially parallel to the <11-20> direction so that trenches are formed in the form of a lattice, it is possible to form nitride semiconductor thin films with good surface flatness on ridges. In this case, it is preferable to set the off-angles θa and θb so that the atoms or molecules of a source material of the nitride semiconductor thin films that have deposited on the ridges diffuse or move in the direction of the longer sides of the ridges, which are separated from one another by the trenches.

By varying the inclination angle (off-angle) of the crystal directions of the substrate as described above, it was possible to obtain better surface flatness on the nitride semiconductor thin films grown on ridges.

When the above-described inclination of the crystal directions of the substrate contains the off-angle θa or off-angle θb alone or both the off-angles θa and θb, even when each off-angle is set at less than 0.05°, it is practically difficult to produce all substrates with an off-angle less than 0.05. In general, laser light emission end surfaces are produced by cleavage. However, cleavage occurs, for example, in the {11-20} or {1-100} plane along the direction of the vector normal to the {0001} plane, and thus the end surfaces are inclined. Thus, setting the off-angle at 4° or more makes chip splitting difficult. Accordingly, it is preferable that the off-angle, that is, the inclination angle of the crystal directions of the substrate, be 0.05° or more but 4° or less Example 1

Figure 9:
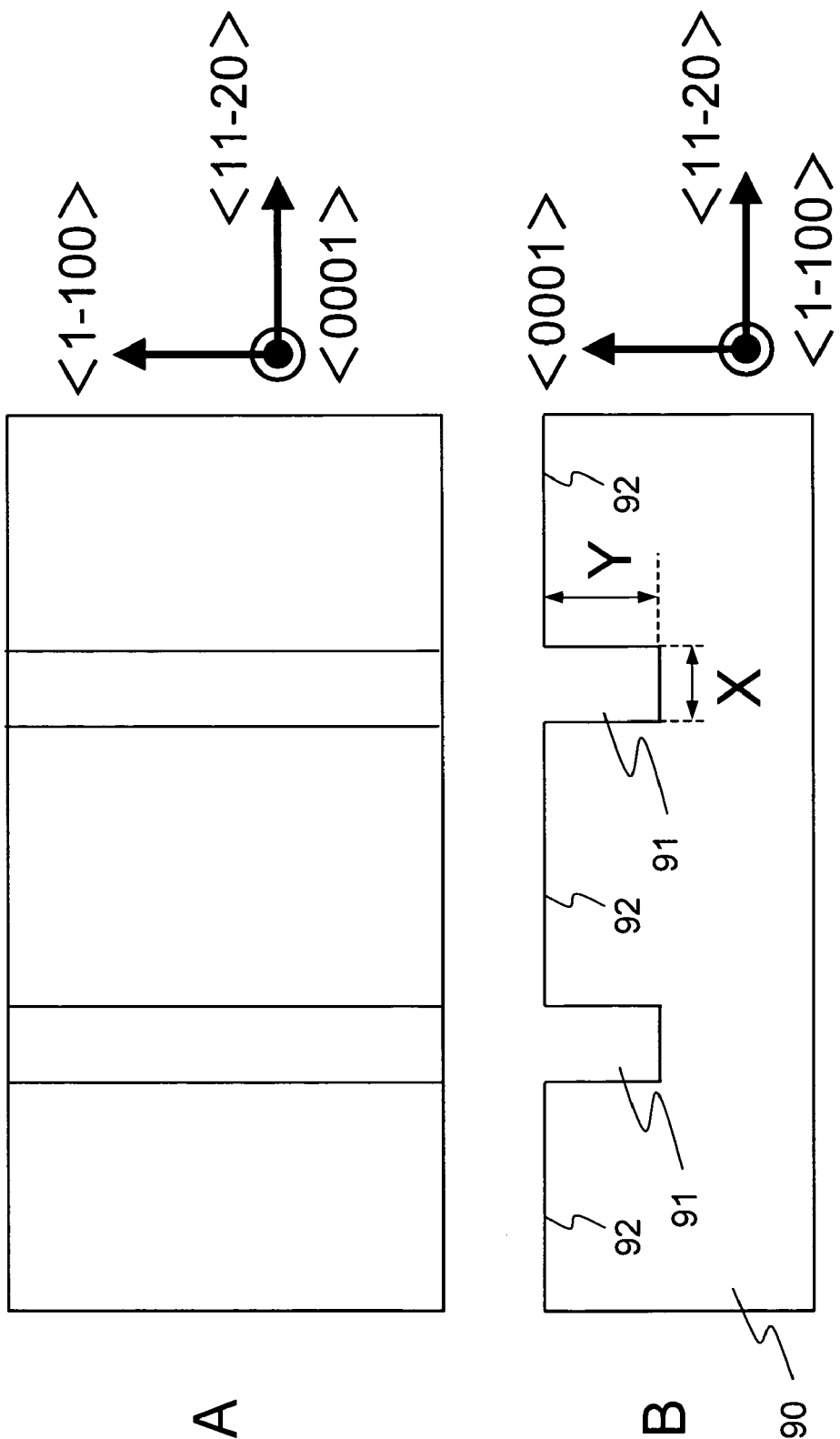
FIG. 9 is a diagram schematically showing the processed substrate used in Examples 1 to 4 of the invention.

Next, a practical example of the first embodiment will be described with reference to the relevant drawings. It should be understood that, although the example presented below deals with, as an example of a nitride semiconductor device, a nitride semiconductor laser device, the present invention is applicable to any other type of nitride semiconductor device. FIG. 11A is a sectional view schematically showing the nitride semiconductor laser device of this example, and FIG. 11B is a top view of FIG. 11A. FIG. 9B is a sectional view schematically showing the processed substrate 90 before the nitride semiconductor thin films are grown thereon in an example of the first embodiment, and FIG. 9A is a top view of FIG. 9B. In FIGS. 9 and 11, the plane directions are indicated together, and it is assumed that the off-angle equals zero. On the processed substrate 90 shown in FIG. 9, a nitride semiconductor multiple-layer film 4 structured, for example, as shown in FIG. 20 is laid to fabricate the nitride semiconductor laser device shown in FIG. 11.

First, the processed substrate 90 is produced in the same manner as the processed substrates 16, 36, and 46 described above. Here, however, used to produce the processed substrate 90 is a substrate having an off-angle θa of −0.35° and an off-angle of −0.02°. The trenches 91 are formed with an opening width X of 5 μm, a dept Y of 5 μm, and a period of 350 μm between adjacent trenches 91.

Figure 20:
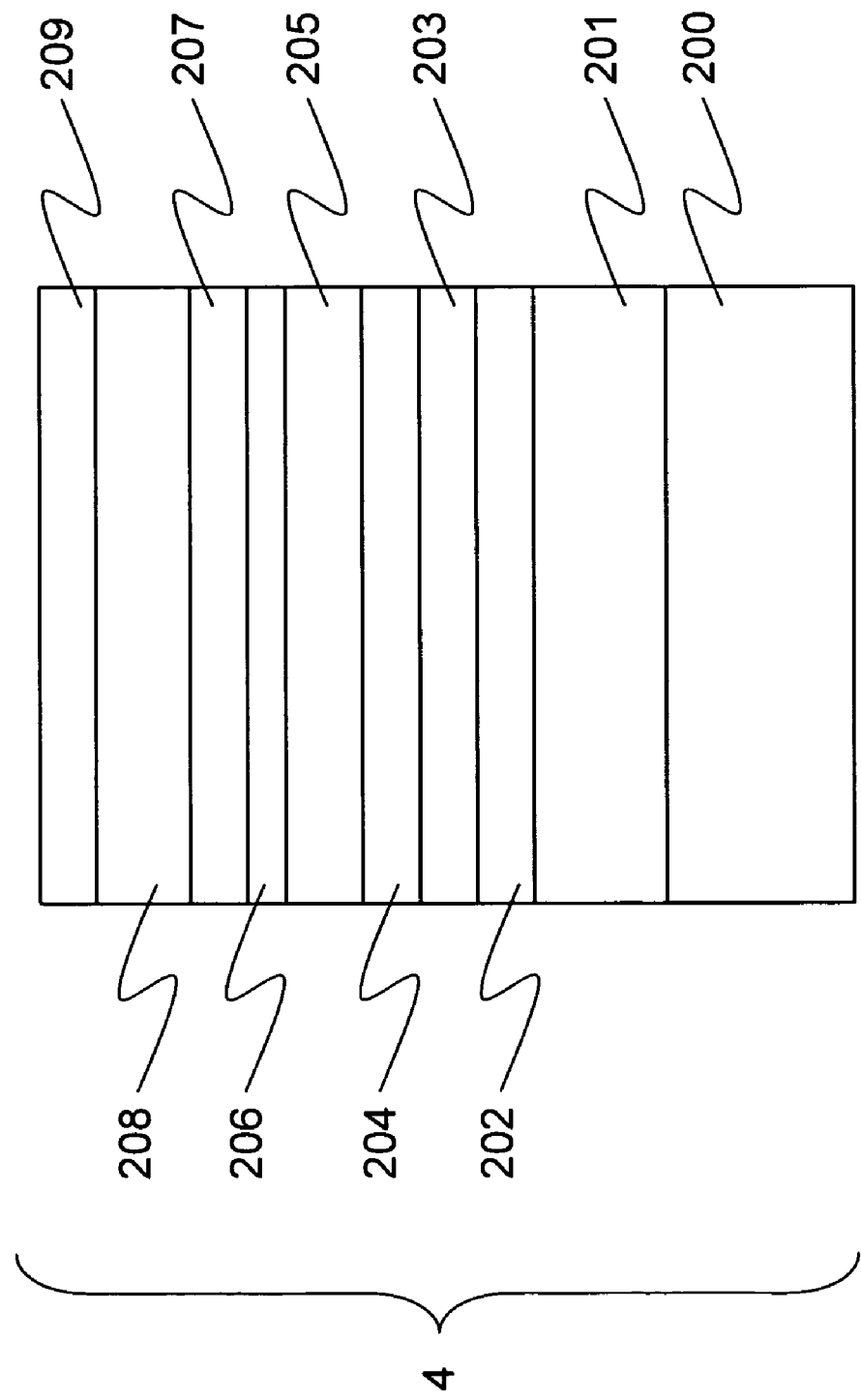
FIG. 20 is a sectional view schematically showing a conventional nitride semiconductor growth layer.

On the processed substrate 90 so produced, by appropriately using a conventionally known technique such as MOCVD, a nitride semiconductor multiple-layer film 4 composed of a plurality of nitride semiconductor thin films as shown in FIG. 20 is laid. Here, first, an n-type GaN layer 200 was grown under the conditions that the growth temperature was 1 075° C. and that the source material V/III ratio (that is, the ratio of the flow rate in moles per unit time at which a source material containing a group V atom is supplied to the flow rate in moles per unit time at which a source material containing a group III atom is supplied) was 1 200. Subsequently, at a growth temperature of 1 075° C., the following layers were laid one after another: an n-type $Al_{0.05}Ga_{0.95}N$ first clad layer 201, an n-type $Al_{0.08}Ga_{0.92}N$ second clad layer 202, an n-type $Al_{0.05}Ga_{0.95}N$ third clad layer 203, and an type GaN guide layer 204. Further on top, the following layers were laid one after another in the order they are named: an active layer 205, a p-type $Al_{0.3}Ga_{0.7}N$ evaporation prevention layer 206, a p-type GaN guide layer 207, a p-type $Al_{0.05}Ga_{0.95}N$ clad layer 208, and a p-type GaN contact layer 209. Here, the active layer 205 was grown at a growth temperature of about 800° C., and the p-type $Al_{0.3}Ga_{0.7}N$ evaporation prevention layer 206, the p-type GaN guide layer 207, the p-type $Al_{0.05}Ga_{0.95}N$ clad layer 208, and the p-type GaN contact layer 209 were grown at a growth temperature of about 1 030° C.

In this way, on the processed substrate 90 having trenches 91 and ridges 92 formed thereon, the nitride semiconductor multiple-layer film 4 composed of a plurality of nitride semiconductor thin films is laid. Here, the opening width etc. of the trenches 91 are not limited to the values specifically mentioned above. If the opening width X of the trenches 91 is less than 3 μm, however, when the nitride semiconductor multiple-layer film 4 is formed, the trenches 91 are easily filled. This not only hinders the strains present inside the nitride semiconductor multiple-layer film 4 from being released, but also causes the atoms or molecules of a source material of the nitride semiconductor thin films that have deposited on the ridges 92 to migrate or otherwise diffuse or move into the trenches 91. Thus, undesirably, the nitride semiconductor multiple-layer film 4 laid on the ridges 92 has poor surface flatness. Likewise, if the depth Y of the trenches 91 is less than 1.5 μm, when the nitride semiconductor multiple-layer film 4 is formed, undesirably, the trenches 91 are easily filled. Thus, it is preferable that the opening width X of the trenches 91 be 3 μm or more, and that the depth Y of the trenches 91 be 1.5 μm or more. Moreover, if the total layer thickness of the nitride semiconductor multiple-layer film 4 formed on the processed substrate 90 is larger than twice the depth Y of the trenches 91, when the nitride semiconductor multiple-layer film 4 is laid on the processed substrate 90, undesirably, the trenches 91 are easily filled. thus, it is preferable that the depth Y of the trenches 91 be larger than one half of the total thickness of the nitride semiconductor multiple-layer film 4 formed on the processed substrate 90.

Moreover, if the width of the ridges 92, lying between adjacent trenches 91, as measured in the direction substantially parallel to the <11-20> direction, that is, in the direction perpendicular to the direction in which the trenches 91 extend and parallel to the surface of the ridges 92, is less than 100 μm, the strains present in the nitride semiconductor multiple-layer film 4 are not released, leading to development of cracks, and in addition it is difficult to fabricate nitride semiconductor laser devices on the ridges 92. On the other hand, if the width of the ridges 92 is larger than 2 000 μm, they no longer prevents development of cracks in the nitride semiconductor multiple-layer film 4. Thus, it is preferable that the width of the ridges 92 be 100 μm or more but 2 000 μm or less.

In the nitride semiconductor multiple-layer film 4, the n-type GaN layer 200 (see FIG. 20), in comparison with AlGaN or other layers, is far more likely to migrate and diffuse or move. For this reason, if the layer thickness of the n-type GaN layer 200 is larger than 0.5 µm, the n-type GaN layer 200 grown on the ridges 92 more easily flows into the trenches 91. Moreover, then the total layer thickness of the nitride semiconductor multiple-layer film 4 is larger, with the result that the trenches 91 are easily filled by the nitride semiconductor multiple-layer film 4. Thus, it is preferable that the layer thickness of the n-type GaN layer 200 be 0.5 µm or less. In consideration of migration, it is preferable that the layer thickness of the n-type GaN layer 200 be 0 µm, that is, growth be started from the n-type $Al_{0.05}Ga_{0.95}N$ first clad layer 201.

It has been found that, when the nitride semiconductor multiple-layer film 4 composed of a plurality of nitride semiconductor thin films is laid, how easily the atoms or molecules of a source material of nitride semiconductor thin films migrate or otherwise diffuse or move varies depending on the growth conditions under which the individual nitride semiconductor thin films are grown. To obtain good flatness on the surface of the nitride semiconductor multiple-layer film 4 grown on the ridges 92, the individual nitride semiconductor thin films need to be grown under conditions that hinder the migration of the atoms or molecules of a source material of nitride semiconductor thin films. Preferred as such growth conditions are that the surface temperature of the processed substrate is 1 050° C. or lower, and that the V/III ratio (the ratio of the flow rate in moles per unit time at which a source material containing a group V atom is supplied to the flow rate in moles per unit time at which a source material containing a group III atom is supplied) is 2 250 or more.

Figure 10:
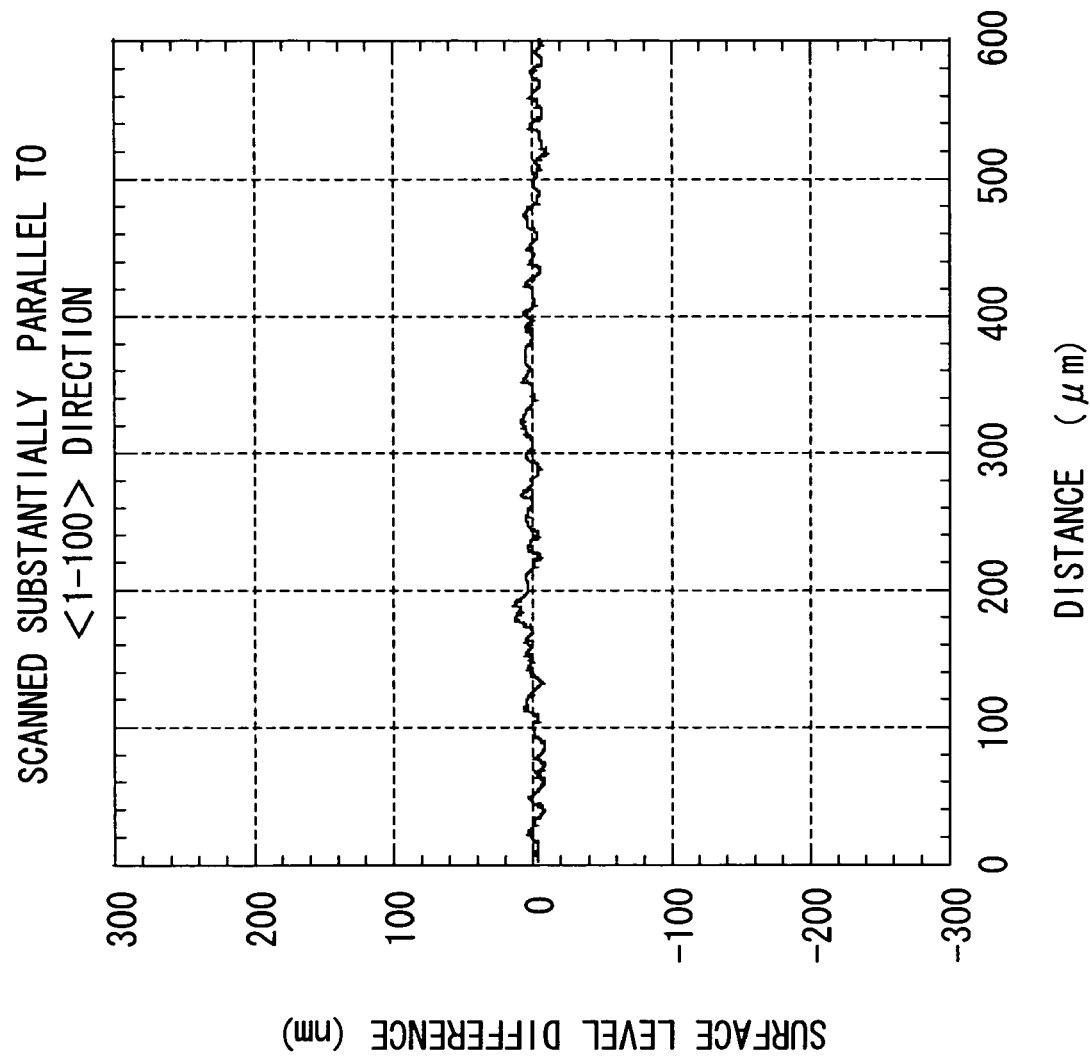
FIG. 10 is a plotting of level variation on the surface of a wafer having a nitride semiconductor growth layer laid on the processed substrate in Example 1 of the invention.

The surface flatness of the surface of the processed substrate 90 having the nitride semiconductor multiple-layer film 4 formed thereon as described above was measured. The result of the measurement of the surface flatness as measured in the direction substantially parallel to the <1-100> direction, that is, in the direction parallel to the direction in which the trenches 91 extend, is shown in FIG. 10. The measurement was performed in a central portion of a ridge 92. Here, as will be understood from the graph in FIG. 10, within the 600 µm wide region measured, the level difference between the highest and lowest parts of the surface is about 20 nm, and is therefore very small in comparison with the measurement result (300 nm) obtained in the case where the processed substrate 6 was produced by the use of a wafer having an off-angle of almost zero (0.02° or less) and then the nitride semiconductor multiple-layer film 4 was formed thereon. Thus, good surface flatness is obtained.

Moreover, by forming the nitride semiconductor multiple-layer film 4 on the processed substrate 90 as described above, the nitride semiconductor laser device shown in FIG. 11 is fabricated. This nitride semiconductor laser device has, on the surface of the nitride semiconductor multiple-layer film 4 formed on the ridges 92 of the processed substrate 90 having the trenches 91 formed thereon, a laser stripe 93 serving as a laser waveguide and a $SiO_2$ film 94 for current constriction so laid as to sandwich the laser stripe 93. Then, on the surface of the laser stripe 93 and the $SiO_2$ film 94, a p-side electrode 95 is formed, and, on the bottom surface of the processed substrate 90, an n-type electrode 96 is formed. An elevated portion formed on the surface of the p-side electrode 95 immediately above the laser stripe 93 is called a stripe 97.

Nitride semiconductor laser devices having a ridge structure, like the one described above, are fabricated by first laying a nitride semiconductor multiple-layer film 4 on a processed substrate 90 and then by appropriately using conventionally known techniques, and therefore no detailed description of the fabrication method etc. thereof will be given. The plurality of nitride semiconductor laser devices thus formed by laying the nitride semiconductor multiple-layer film 4 on the processed substrate 90 (wafer) are then split into individual devices. Here, first, part of the processed substrate 90 is removed so that the wafer has a thickness of about 100 µm. Then, as the n-type electrode 96, on the bottom surface of the processed substrate 90, Hf/Al layers are formed in this order from the processed substrate 90 side. Subsequently, the wafer is cleaved along the direction substantially parallel to the <11-20> direction, that is, in the direction perpendicular to the direction in which the trenches 91 extend and parallel to the surface of the ridges 92, to form resonator end surfaces. Thus, bars (unillustrated) each provided with a plurality of nitride semiconductor laser devices are produced. In this example, the cleavage plane of the nitride semiconductor is the {11-20} plane, and is inclined by the off-angle Θa°. This had caused fears that the wafer would be difficult to cleave and that it would be difficult to obtain good cleavage surfaces. In reality, however, it was confirmed that, so long as the off-angle was 4° or less, cleavage surfaces good enough to be acceptable as end surfaces of nitride semiconductor laser devices could be obtained. Here, it is preferable that the resonator length of the nitride semiconductor laser device be 300 µm or more but 1 200 µm or less. In this example, the resonator length was 600 µm. Moreover, on the resonator end surfaces formed by cleaving the wafer as described above, dielectric films of $SiO_2$ and $TiO_2$ are alternately vapor-deposited by electron beam deposition or the like to form dielectric multiple-layer films. The materials of these dielectric multiple-layer films are not limited to $SiO_2/TiO_2$, but may be $SiO_2/Al_2O_3$, or the like. The materials of the n-type electrode 96 are not limited to those specifically mentioned above, but may be Hf/Al/Mo/Au, Hf/Al/Pt/Au, Hf/Al/W/Au, Hf/Au, Hf/Mo/Au, or the like.

In a nitride semiconductor laser device like the one shown in FIG. 11, the p-side electrode 95 is formed of, for example, Mo/Au or Mo/Pt/Au from the nitride semiconductor multiple-layer film 4 side, or a single layer of Au. In this example, a $SiO_2$ film 94 is used as an insulating layer for current construction; instead, any other insulating material such as ZrO, $TiO_2$, or $Si_3N_4$ may be used.

The bars thus produced are then split into chips to obtain individual nitride semiconductor laser devices. Since this splitting is performed by a conventionally known technique, no detailed description thereof will be given.

In the nitride semiconductor laser devices thus fabricated, no development of cracks was observed. Moreover, from among a plurality of nitride semiconductor laser devices of this example fabricated, 100 nitride semiconductor laser devices were randomly extracted, and the FWHM (full width at half maximum) of their FFP (far-field pattern) in the horizontal and vertical directions was measured. Here, nitride semiconductor laser devices whose actual FFP FWHM was within ±1 degree of the design value thereof were counted as non-defective ones. The result was that 94 nitride semiconductor laser devices met the requirement for the FWHM of their FFP, indicating a very high yield.

As described above, by forming a nitride semiconductor multiple-layer film 4 by growing a plurality of nitride semiconductor thin films on a processed substrate 90 having off-angles θa and θb, it is possible to reduce variations in the p-layer thickness and thereby obtain good flatness on the nitride semiconductor thin film, and it is also possible to suppress development of cracks and thereby fabricate nitride semiconductor laser devices with satisfactory characteristics at high yields.

Example 2

In this example, the processed substrate is produced in the same manner as in Example 1. The differences are: the substrate used to produce the processed substrate has an off-angle θa of −0.05° and an off-angle θb of −0.39°; the opening width of trenches is 80 μm; and the period between adjacent trenches is 300 μm. In other respects, nitride semiconductor laser devices were fabricated in the same manner as in Example 1.

In this example, as in Example 1, after the nitride semiconductor multiple-layer film 4 is laid on the processed substrate, the surface flatness of the surface of the nitride semiconductor multiple-layer film 4 formed on the ridges was measured. Within the 600 μm wide region so measured, the level difference between the highest and lowest parts of the surface was 24 nm, and thus good surface flatness was obtained.

Moreover, from among a plurality of nitride semiconductor laser devices of this example fabricated, 100 nitride semiconductor laser devices were randomly extracted, and the FWHM (full width at half maximum) of their FFP (far-field pattern) in the horizontal and vertical directions was measured. Here, nitride semiconductor laser devices whose actual FFP FWHM was within ±1 degree of the design value thereof were counted as non-defective ones. The result was that 91 nitride semiconductor laser devices met the requirement for the FWHM of their FFP, indicating a very high yield.

Example 3

In this example, the processed substrate is produced in the same manner as in Example 1. The differences is: the substrate used to produce the processed substrate has an off-angle θa of 0.21° and an off-angle θb of −0.21°. In other respects, nitride semiconductor laser devices were fabricated in the same manner as in Example 1.

In this example, as in Example 1, after the nitride semiconductor multiple-layer film 4 is laid on the processed substrate, the surface flatness of the surface of the nitride semiconductor multiple-layer film 4 formed on the ridges was measured. Within the 600 μm wide region so measured, the level difference between the highest and lowest parts of the surface was 10 nm, and thus good surface flatness was obtained.

Moreover, from among a plurality of nitride semiconductor laser devices of this example fabricated, 100 nitride semiconductor laser devices were randomly extracted, and the FWHM (full width at half maximum) of their FFP (far-field pattern) in the horizontal and vertical directions was measured. Here, nitride semiconductor laser devices whose actual FFP FWHM was within ±1 degree of the design value thereof were counted as non-defective ones. The result was that 97 nitride semiconductor laser devices met the requirement for the FWHM of their FFP, indicating a very high yield.

Example 4

In this example, the processed substrate is produced in the same manner as in Example 1. The differences are: the substrate used to produce the processed substrate has an off-angle θa of 0.10° and an off-angle θb of −0.02°; of the layers of which the nitride semiconductor multiple-layer film 4 is composed, the n-type GaN layer 200, the n-type $Al_{0.05}Ga_{0.95}N$ first clad layer 201, the n-type $Al_{0.08}Ga_{0.92}N$ second clad layer 202, the n-type $Al_{0.05}Ga_{0.95}N$ third clad layer 203, and the n-type GaN guide layer 204 were grown at a growth temperature of 1 030° C.; and the n-type GaN layer 200 and the n-type GaN guide layer 204 were grown under the condition that the V/III ratio of the source materials was 4 500. In other respects, nitride semiconductor laser devices were fabricated in the same manner as in Example 1.

In this example, as in Example 1, after the nitride semiconductor multiple-layer film 4 is laid on the processed substrate, the surface flatness of the surface of the nitride semiconductor multiple-layer film 4 formed on the ridges was measured. Within the 600 μm wide region so measured, the level difference between the highest and lowest parts of the surface was 28 nm, and thus good surface flatness was obtained.

Moreover, from among a plurality of nitride semiconductor laser devices of this example fabricated, 100 nitride semiconductor laser devices were randomly extracted, and the FWHM (full width at half maximum) of their FFP (far-field pattern) in the horizontal and vertical directions was measured. Here, nitride semiconductor laser devices whose actual FFP FWHM was within ±1 degree of the design value thereof were counted as non-defective ones. The result was that 90 nitride semiconductor laser devices met the requirement for the FWHM of their FFP, indicating a very high yield.

As described above, in this example, the off-angles of the substrate are smaller than in Examples 1 to 3. However, of the layers of which the nitride semiconductor multiple-layer film 4 is composed, the n-type GaN layer 200, the n-type $Al_{0.05}Ga_{0.95}N$ first clad layer 201, the n-type $Al_{0.08}Ga_{0.92}N$ second clad layer 202, the n-type $Al_{0.05}Ga_{0.95}N$ third clad layer 203, and the n-type GaN guide layer 204 are grown under growth conditions that hinder migration. This helped to fabricate nitride semiconductor laser devices with satisfactory characteristics at a high yield.

Second Embodiment

Formation of Trenches

FIG. 12A is a perspective view schematically showing a portion around trenches of a processed substrate having a nitride semiconductor multiple-layer film laid thereon, and FIG. 12B is a sectional view along line A-A shown in FIG. 12A. Reference numeral 120 represents the processed substrate, reference numeral 121 represents the nitride semiconductor multiple-layer film, and reference numeral 122 represents the trenches.

In this embodiment, a nitride semiconductor substrate whose surface is the C plane (0001) is used. First, over the entire surface of the nitride semiconductor substrate, $SiO_2$ or the like (unillustrated) is vapor-deposited by sputtering so as to have a film thickness of 1 μm. The film of the $SiO_2$ or the like may be formed by any other method such as electron beam vapor deposition or plasma CVD.

Next, by a common lithography process, resist is laid in a patter having stripe-shaped windows with a width (indicated by W in FIG. 12) of 5 μm and a period (indicated by T in FIG. 12B) of 250 μm in the [1-100] direction. This period T depends on the width of semiconductor laser chips; specifically, when the chips has a width of 200 μm, the period T is set at 200 μm. Then, by ICP (inductively coupled plasma), RIE (reactive ion etching), or the like, the $SiO_2$ is etched to expose, with a width of 5 μm, the surface of the nitride semiconductor substrate and thereby form a mask of $SiO_2$ for forming trenches on the nitride semiconductor substrate. Then, the nitride semiconductor substrate is etched to form the trenches 122. The nitride semiconductor substrate thus having the trenches formed thereon is called the processed substrate 120.

The depth (indicated by D in FIG. 12B) of the trenches 122 is, for example, 5 μm. Here, it is preferable that the depth D of the trenches 122 be 2 μm or more but 20 μm or less. If the depth D is less than 2 μm, the trenches 122 may be filled by the nitride semiconductor multiple-layer film 121. If the trenches 122 are filled, cracks may develop, the layer thicknesses may become less uniform within the surface, and other problems arise. However, if the total of the layer thicknesses of the nitride semiconductor multiple-layer film 121 is 4 μm or less, so long as the depth D is in the range from 1 μm to 2 μm, both ends inclusive, it is possible to prevent cracks and maintain flatness. On the other hand, if the depth D is larger than 20 μm, problems arise in the photolithography and polishing processes. For example, in the photolithography process, the thickness of the resist on the surface of the processed substrate 120 tends to be non-uniform, and thus the resist may remain where it has not been sufficiently exposed to light. On the other hand, in the polishing process, when the wafer is polished to be made as thin as about 100 μm in preparation for chip splitting, the wafer may break.

It is preferable that the width W of the trenches 122 be 1 μm or more. If the width W is less than 1 μm, when the nitride semiconductor multiple-layer film 121 is grown, the trenches 122 is filled completely. This is because the nitride semiconductor multiple-layer film 121 growing from both edges of the trenches 122 forms bridges at the top ends of the trenches, and meet above the trenches 122. When the trenches 122 are filled, cracks may develop, the layer thicknesses may become less uniform within the surface, and other problems arise.

Here, the trenches 122 are utterly different from the technique of exploiting the effect of lateral (horizontal) growth to form trenches on a substrate for the purpose of reducing the density of defects spreading from the surface to a crystal growth film. In lateral growth, to obtain the effect of horizontal growth, trenches are usually formed at intervals about equal to or smaller than the film thickness of the layer formed and, even in a case where the groove-to-groove intervals are maximized, at about three times that film thickness.

By contrast, in this embodiment, the trenches 122 are formed not for the above-mentioned purpose, but for the purpose of preventing cracks. The intervals here are of the same order as the width of nitride semiconductor laser devices, specifically about 0.1 mm at the minimum. Furthermore, simply forming the trenches 22 results in greatly degraded flatness. Thus, it is preferable that the intervals (period) be 4 mm or less. If the intervals (period) are larger than 4 mm, it is impossible to effectively release lattice strains present inside the film and strains resulting from differences in thermal expansion coefficients, and thus cracks develop. Thus, it is preferable that the intervals (period) of the trenches 122 be 0.1 mm or more but 4 mm or less.

Then, after etching, the $SiO_2$ is completely removed with an etchant such as HF to complete the processing of the substrate before the growth of the nitride semiconductor multiple-layer film 121.

In the above description, the $SiO_2$ and the nitride semiconductor substrate are etched by gas-phase etching; alternatively, they may be etched with an etchant in the liquid phase. Trench formation by etching may be performed after first growing a nitride semiconductor layer of GaN, InGaN, AlGaN, InAlGaN, or the like. That is, it is also possible to first grow a nitride semiconductor layer, then form trenches 122, and the grow a nitride semiconductor multiple-layer film 121.

Also in a case where a substrate other than a nitride semiconductor substrate (for example, a sapphire, SiC, Si, or GaAs substrate) is used, first a nitride semiconductor layer of GaN, InGaN, AlGaN, InAlGaN, or the like is formed, then trenches 122 are formed, and then a nitride semiconductor multiple-layer film 121 is grown.

Epitaxial Growth of a Nitride Semiconductor Multiple-Layer Film

Figure 14:
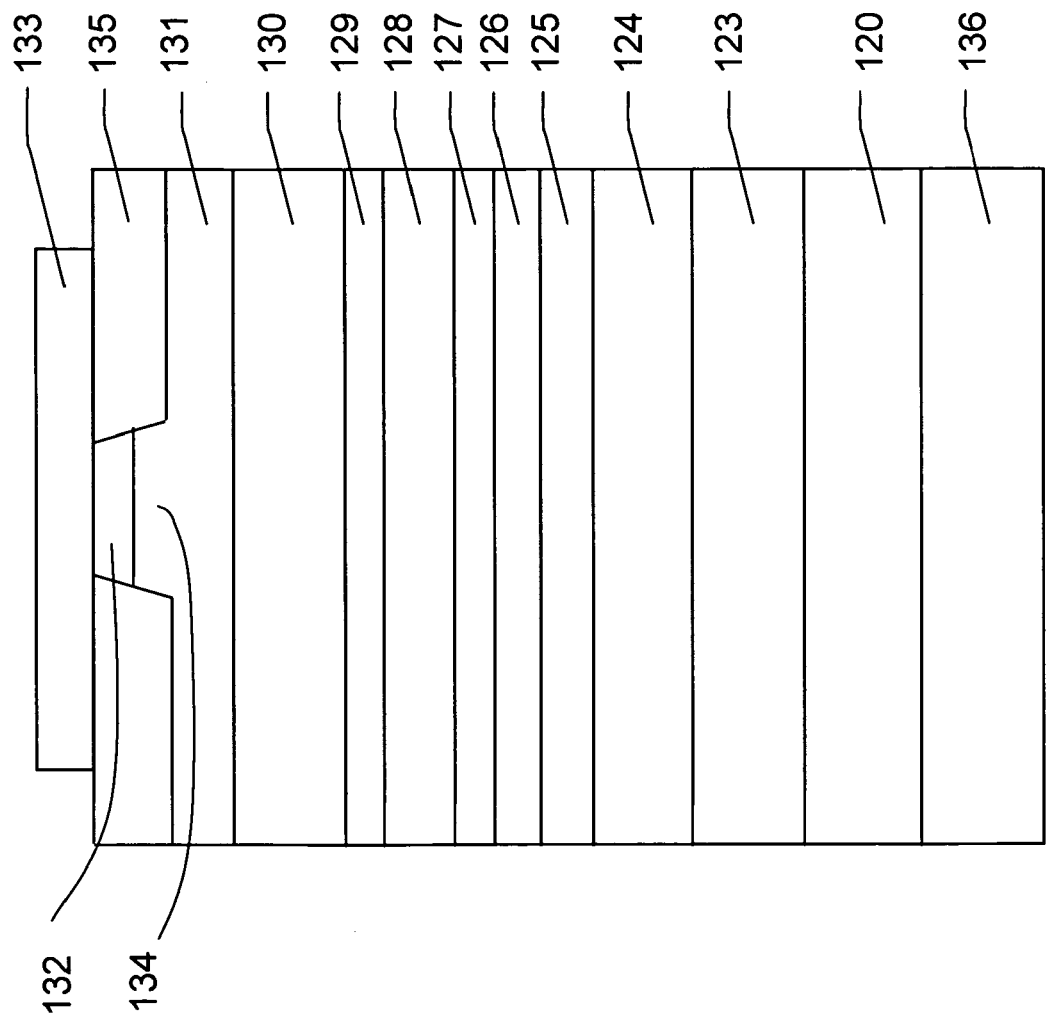
FIG. 14 is a sectional view of part B shown in FIG. 2.

FIG. 13A is a front view of a nitride semiconductor device, and FIG. 13B is a top view of FIG. 13A. FIG. 14 is a sectional view of part B shown in FIG. 13. Now, with reference to FIG. 14, how the nitride semiconductor device is fabricated will be described.

First, on an MOCVD machine, using $NH_3$ as a group V source material and TMGa (trimethylgallium) or TEGa (triethylgallium) as a group III source material, with silane ($_{SiH4}$) as a dopant source material added thereto, an n-type primer GaN layer 123 having a film thickness of 0.2 μm is formed on the processed substrate 120 at a substrate temperature of 1 100° C. The primer GaN layer 123 is an example of a nitride semiconductor primer layer; instead, any other nitride semiconductor primer layer may be used, such as AlGaN, AlInGaN, AlGaNP, or AlGaNAs.

Next, at a substrate temperature of 1 050° C., by using a group III source material such as TMAl (trimethylaluminum) or TEAl (triethylaluminum), three-layer n-type clad layers are grown, which consist of, from the primer GaN layer 123 side, an n-type $Al_{0.05}Ga_{0.95}N$ clad layer 124 having a layer thickness of 2.3 μm, an n-type $Al_{0.08}Ga_{0.92}N$ clad layer 125 having a layer thickness of 0.2 μm, and an n-type $Al_{0.05}Ga_{0.95}N$ clad layer 126 having a layer thickness of 1.0 μm. As an n-type impurity, $5\times10^{17}$ to $1\times10^{19}/cm^3$ of Si is added.

Subsequently, an n-type GaN light guide layer (with an Si impurity concentration of $1\times10^{16}$ to $1\times10^{18}/cm^3$) 127 is grown to have a thickness of 0.2 μm.

Then, the substrate temperature is lowered to 800° C., and an active layer (having a multiple quantum well structure) 128 composed of three periods of $In_{0.1}Ga_{0.9}N$ well layers each having a thickness of 4 nm combined with $In_{0.01}Ga_{0.99}N$ barrier layers each having a thickness of 8 nm is grown in the following order: a barrier layer, a well layer, a barrier layer, a well layer, a barrier layer, a well layer, and a barrier layer. It is preferable that growth be interrupted for 1 second or more but 180 seconds or less between a barrier layer and a well layer or between a well layer and a barrier layer, because doing so helps improve the flatness of the individual layers and thus helps reduce the light emission FWHM. Here, it may arbitrarily be avoided to add $SiH_4$ to the barrier layers or to both the barrier and well layers.

In a case where As is added to the active layer 128, $AsH_3$ (arsine) or TBAs (tertiary-butylarsine) is used as a source material. In a case where P is added to the active layer 128, $PH_3$ (phosphine) or TBP (tertiary-butylphosphine) is used as a source material. In a case where Sb is added to the active layer 128, TMSb (trimethylantimony) or TESb (triethylantimony) is used as a source material. When the active layer 128 is formed, as a source material of N, instead of $NH_3$, any other source material may be used, such as $N_2H_4$ (hydrazine), $C_2N_2H_8$ (dimethylhydrazine), or any organic source material containing N.

Next, the substrate temperature is raised to 1 000° C., and the following layers are grown one after another: a p-type $Al_{0.2}Ga_{0.8}N$ carrier block layer 129 having a thickness of 0.02 μm, a p-type GaN light guide layer 130 having a thickness of 0.02 μm, a p-type $Al_{0.05}Ga_{0.95}N$ clad layer 131 having a thickness of 5 μm, and a p-type GaN contact layer 132 having a thickness of 0.1 μm. As a source material for a p-type impurity, $EtCP_2Mg$ (bisethylcyclopentadienylmagnesium) is used, and Mg is added in a concentration of $1\times10^{18}$ to $2\times10^{20}$/cm$^3$. It is preferable that the p-type GaN contact layer 132 has increasingly high p-type impurity concentrations toward a p-electrode 133. This helps reduce the contact resistance ascribable to the p-electrode 133. To remove residual hydrogen in the p-type layers, which hinders the activation of Mg used as a p-type impurity, a trace amount of oxygen may be mixed during the growth of the p-type layers.

The sum of the thicknesses of the individual layers of the nitride semiconductor multiple-layer film 121 produced as described above is 3.58 μm. The nitride semiconductor multiple-layer film 121 is composed of the primer GaN layer 123, the n-type $Al_{0.05}Ga_{0.95}N$ clad layer 124, the n-type $Al_{0.08}Ga_{0.92}N$ clad layer 125, the n-type $Al_{0.05}Ga_{0.95}N$ clad layer 126, the n-type GaN light guide layer 127, the active layer 128, the p-type $Al_{0.2}Ga_{0.8}N$ carrier block layer 129, the p-type GaN light guide layer 130, the p-type $Al_{0.05}Ga_{0.95}N$ clad layer 131, and the p-type GaN contact layer 132.

After the p-type GaN contact layer 132 is grown, all the gas inside the reactor of the MOCVD machine is replaced with nitrogen carrier gas and NH$_3$, and the temperature is lowered at a rage of 60° C./min. When the substrate temperature becomes equal to 80°, the supply of NH$_3$ is stopped, then this substrate temperature is held for 5 minutes, and then the substrate temperature is lowered to room temperature. Here, it is preferable that the temperature at which the substrate is held be between 650° C. to 900° C., and that the period at which it is held at that temperature be 3 minutes or more but 10 minutes or less. Moreover, it is preferable that the rate at which the temperature is lowered be 30° C./min or more.

The nitride semiconductor multiple-layer film 121 produced as described above was evaluated by Raman measurement. The result was that, even without p-typifying annealing performed after the wafer was taken out of the MOCVD machine, p-typified characteristics were observed (Mg was activated) immediately after growth. Moreover, the contact resistance ascribable to the formation of the p-electrode 133 was lower. The above-described method may be combined with conventional p-typifying annealing to achieve a higher Mg activation rate.

In the embodiment described above, the active layer 128 is so composed as to start with a barrier layer and end with a barrier layer; instead, it may be so composed as to start with a well layer and end with a well layer. The number of well layers is not limited to three as specifically described above, but may be ten or less, because then they offer a low threshold current density and can thus oscillate continuously at room temperature. A particularly preferable range of the number of well layers is from two to six, because then they offer a particularly low threshold current density. The above-described active layer 128 may additionally contain Al. Here, no Si as an impurity is added to either of the well and barrier layers of which the active layer 128 is composed; an impurity, however, may be added. Adding an impurity such as Si to the active layer 128 tends to increase the light emission intensity. Other than Si, such impurities include O, C, Ge, Zn, and Mg, and these may be used singly or in combination of two or more of them. It is preferable that the total amount of impurity added be about $1\times10^{17}$ to $8\times10^{18}$/cm$^3$. An impurity may be added to both the well and barrier layers or to the well or barrier layers alone.

The p-type $Al_{0.2}Ga_{0.8}N$ carrier block layer 129 may have any composition other than that specifically described above. AlGaN having In added thereto undergoes p-typification even when grown at lower temperature. This helps reduce the damage that the active layer 128 receives during crystal growth, and is thus preferable. The carrier block layer 129 itself may be omitted, but providing it contributes to a lower threshold current density. This is because the carrier block layer 129 acts to enclose carriers in the active layer 128. The higher the Al content in the p-type $Al_{0.2}Ga_{0.8}N$ carrier block layer 129, the more intensely carriers are enclosed, and thus the better. On the other hand, it is preferable to reduce the Al content so long as the enclosure of carriers is maintained, because doing so helps increase the mobility of carriers in the carrier block layer 129, and thus helps reduce the electrical resistance there.

In the embodiment described above, the n-type clad layers 124 to 126 and the p-type clad layers 131 are each formed of a crystal of $Al_{0.05}Ga_{0.95}N$ or $Al_{0.08}Ga_{0.92}N$. Instead, a crystal of AlGaN having an Al content other than 0.05 or 0.08 may be used. The higher the Al content in those layers, the larger their differences in energy gap and in refractive index from the active layer 128. This helps efficiently enclose carriers and light in the active layer 128, and helps reduce the laser oscillation threshold current density. On the other hand, reducing the Al content so long as the enclosure of carriers and light is maintained helps increase the mobility of carriers in the clad layers 124 to 126, and thus helps lower the operating voltage of devices.

In the embodiment described above, the n-type AlGaN clad layers 124 to 126 have a three-layer structure. This permits the vertical lateral mode to have a single peak, increases the light enclosure efficiency, and thus helps enhance the optical characteristics of the laser and reduce the laser threshold current density. The number of n-type AlGaN clad layers may be other than three; that is, one or more of them may be used without causing any problem. In the above description, the clad layers are formed of a three-element mixed crystal, namely AlGaN; instead, a four-element mixed crystal may be used, such as AlInGaN, AlGaNP, or AlGaNAs. For a lower electrical resistance, the p-type clad layer 130 may be given a super-lattice structure composed of a p-type AlGaN layer and a P-type GaN layer, or a super-lattice layer composed of a p-type AlGaN layer and a p-type AlGaN layer, or a super-lattice structure composed of a p-type AlGaN layer and a p-type InGaN layer.

Characteristics of the Nitride Semiconductor Multiple-Layer Film

Figure 15:
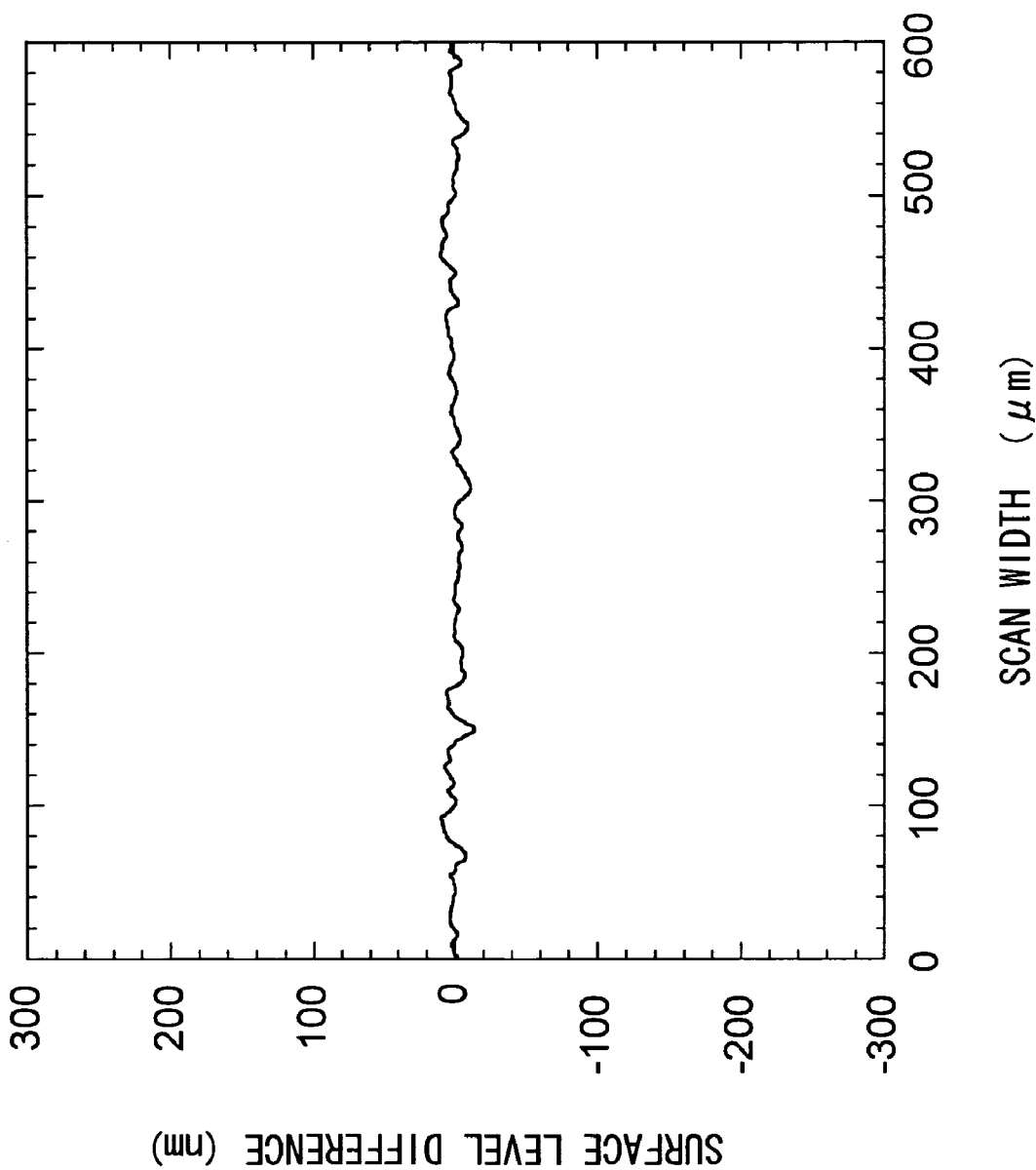
FIG. 15 is a diagram showing the result of measurement of the surface flatness of a nitride semiconductor multiple-layer film in the [1-100] direction.

In the nitride semiconductor multiple-layer film 121 produced in this embodiment, no cracks were observed. Moreover, surface flatness within the surface was measured on a touch-probe-type level difference tester. FIG. 15 shows the result of measurement of the surface flatness of the nitride semiconductor multiple-layer film 121 in the [1-100] direction. The result shows that, within the 600 μm range measured, surface roughness (Ra) was 100 Å or less, and thus that a flat surface with very small surface irregularities was obtained. Ra was measured in detail also over the entire surface of the substrate, and the result indicated that a flat surface was obtained.

Moreover, under a SEM (scanning electron microscope), the distribution of the thicknesses of the individual layers of the nitride semiconductor multiple-layer film 121 within the substrate surface was measured. The result showed that the magnitude of the standard deviation, which indicated the degree of variation, was as small as 5% at most. That is, it was found that the thicknesses of the individual layers of the multiple-layer film were uniform.

Device Splitting Process

Next, a description will be given of the process of taking the wafer having the nitride semiconductor multiple-layer film 121 laid on the trenches 12 out of the MOCVD machine and then processing the wafer into nitride semiconductor device chips.

First, ridge stripe portions 134, which are to function as laser light waveguide regions, are formed. This is done by etching the epitaxial wafer from the surface side thereof to the middle or bottom end of the p-type clad layer 131 so that stripe-shape portions are left. Here, the stripe width is 1 to 3 μm and, preferably, 1.3 to 2 μm. Then, an insulating film 135 is formed elsewhere than in the ridge stripe portions 134. Here, the insulating film 135 can be formed of AlGaN. Since the part of the p-type GaN contact layer 132 that has remained unetched is exposed, on this part and on the insulating film 135, a p-electrode 133 is formed by vapor-depositing Pd/Mo/Au in this order.

Here, the insulating film 135 may be formed of any material other than the one specifically mentioned above, such as an oxide or nitride of titanium, zirconia, tantalum, aluminum, or the like. The p-electrode (216) may instead be formed of Pd/Pt/Au, Pd/Au, or Ni/Au.

Furthermore, the bottom surface of the epitaxial wafer (the surface of the nitride semiconductor substrate) is polished to make the wafer 80 to 200 μm thick to facilitate the later performed splitting of the wafer. An n-electrode 136 is formed by laying Hf/Al in this order on the bottom surface 120. The n-electrode 136 may instead be formed of Hf/Al/Mo/Au, Hf/Al/Pt/Au, Hf/Al/W/Au, Hf/Au, Hf/Mo/Au, or a modified combination of one of these where Hf is replaced with Ti or Zr.

Lastly, the epitaxial wafer is cleared in the direction perpendicular to the ridge stripe direction to produce Fabry-Perot resonators with a resonator length of 600 μm. It is preferable that the resonator length be 250 μm to 1 000 μm. Through this process, the wafer is split into bars each having a laterally extending array of nitride semiconductor devices linked together. The resonator end surfaces of the nitride semiconductor devices having the ridge stripe portions 134 formed along the <1-100> direction are the {1-100} planes of the nitride semiconductor crystal. Instead of feedback at end surfaces, it is also possible to adopt DFB (distributed feedback), whereby feedback is achieved with diffraction gratings provided inside, or DBR (distributed Bragg reflector, whereby feedback is achieved by diffraction gratings provided outside.

After the resonator end surfaces of the Fabry-Perot resonators are formed, dielectric films of $SiO_2$ and $TiO_2$ having reflectivity of about 80% are alternately vapor-deposited on those end surfaces to form dielectric multiple-layer reflective films (unillustrated). The dielectric multiple-layer reflective films may be formed of any other dielectric material. Further thereafter, the bars are split into individual devices to obtain the nitride semiconductor device shown in FIG. 13. The device has a laser light waveguide region (ridge stripe portion 134) located in the middle thereof, and has a lateral width of 250 μm.

Characteristics of the Nitride Semiconductor Device

Through experiments, the nitride semiconductor device was confirmed to achieve a laser oscillation lifetime of 5 000 hours or more under the following conditions: oscillation wavelength, 405±2 nm; laser output, 60 mW; and ambient temperature, 70° C. Moreover, a flat surface with small surface irregularities was obtained, and the thicknesses of the individual layers of the nitride semiconductor multiple-layer film 121 were highly uniform within the substrate surface. Thus, there was little variation in characteristics among individual devices, which thus offered high reliability. As a result, the number of devices with characteristics that do not meet the requirements for non-defective ones was reduced, and yields were improved.

Relationship Between Surface Flatness and Crack Development

Figure 16:
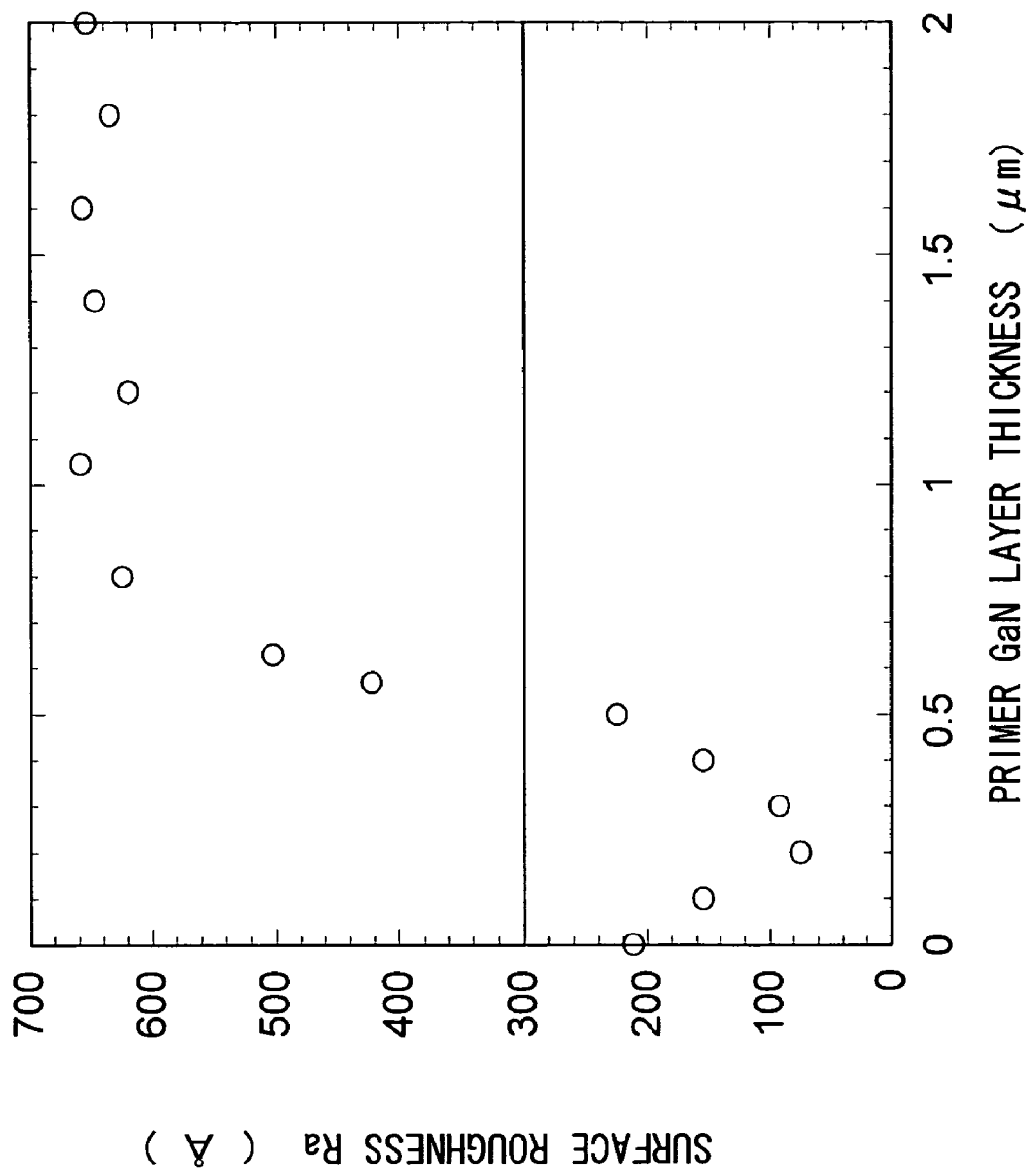
FIG. 16 is a diagram showing the surface roughness of a nitride semiconductor multiple-layer film as measured when the thickness of a primer GaN layer is varied.

Now, a description will be given of the relationship between surface flatness and crack development as observed when the layer thickness of the primer GaN layer 123 is varied with respect to the depth D and the width W of the trenches 122. FIG. 16 shows the result of measurement of the surface roughness of the nitride semiconductor multiple-layer film 121 as observed when the thickness of the primer GaN layer 123 is varied from 0 to 2.0 μm.

Through experiments performed beforehand, it has been known that the permissive range of surface roughness with respect to variations in the characteristics of devices and the lifetime of devices is 300 Å or less. This thickness, 300 Å, corresponds to about 5% of the total thickness of a device when the p-type layers have a thickness of 0.62 μm. Moreover, if surface roughness is 5%, it indicates that comparable variations exist in the thicknesses of the individual layers (here, the thickness of the p-type layers). Variations in the thickness of the p-type layer most greatly affect laser characteristics. When the ridge stripe portion 134 as a current constriction structure is formed, a 2 μm wide part of the p-layers is left as the ridge stripe portion 134, and the remaining part is etched by gas-phase etching such as ICP. Since it is known that what most greatly affects laser characteristics is the height of the ridge stripe portion 134, that is, the distance from the active layer 128 to the etched region, if the thickness of the p-type layers varies from place to place within the substrate surface, laser characteristics accordingly vary. Thus, large surface roughness not only leads to low yields, but also adversely affects the lifetime of devices.

FIG. 16 shows that, when the thickness of the primer GaN layer 123 is 0.5 μm or less, surface roughness is 300 Å or less. Thus, it is preferable that the thickness of the primer GaN layer 123 used in this embodiment be 0.5 μm or less. In a case where the nitride semiconductor multiple-layer film 121 includes GaN other than the primer GaN layer 123, it is preferable that the total thickness of the GaN layers in the nitride semiconductor multiple-layer film 121 be 15% or less of the total layer thickness of the nitride semiconductor multiple-layer film 121.

Thus, an intensive study was conducted to find why, when the thickness of the primer GaN layer 123 is more than 0.5 mm, large surface roughness results as shown in FIG. 16, in other words, a large layer thickness distribution appears within the surface. Through the study, it was found that the thicknesses of the individual layers of the nitride semiconductor multiple-layer film 121 vary because, when the nitride semiconductor multiple-layer film 121 is epitaxially grown, the primer GaN layer 123 is affected thereby.

Figures 17A, 17B:
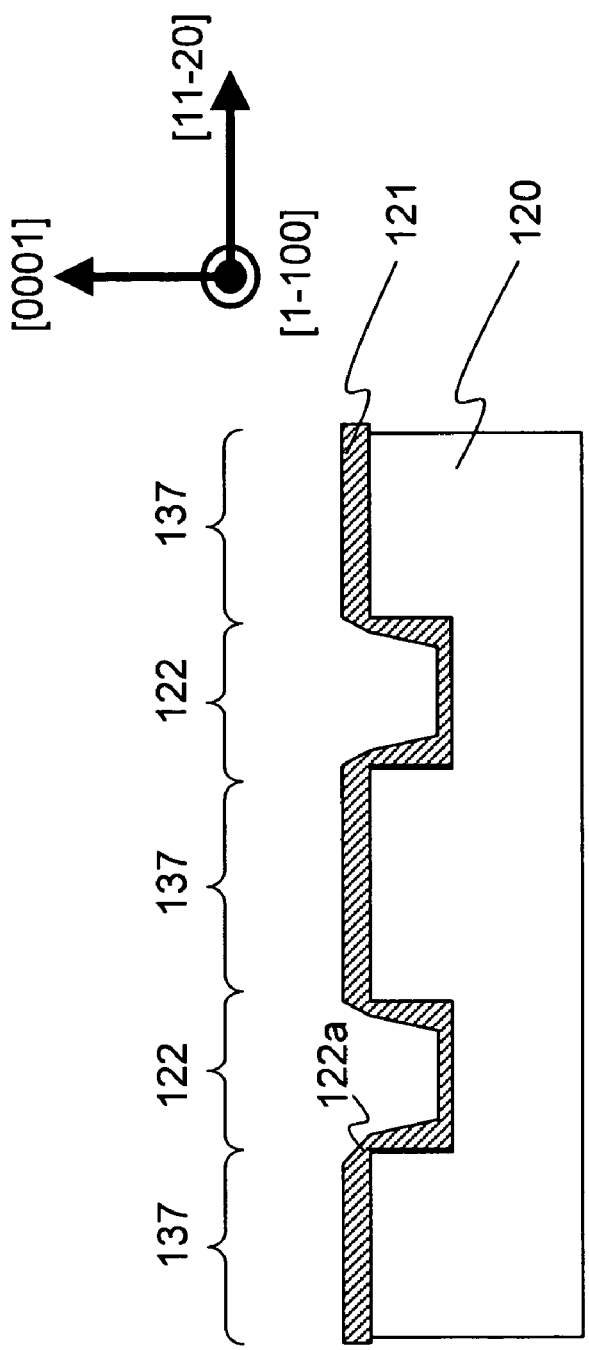
FIG. 17A is a sectional view of a processed substrate having formed thereon a nitride semiconductor multiple-layer film with good surface flatness.
FIG. 17B is a sectional view of a processed substrate having formed thereon a nitride semiconductor multiple-layer film with poor surface flatness.

FIG. 17A is a sectional view of a processed substrate 120 having a nitride semiconductor multiple-layer film 121 with good flatness, and FIG. 17B is a sectional view of a processed substrate 120 having a nitride semiconductor multiple-layer film 121 with poor flatness. Now, with reference to FIGS. 12 and 17, a detailed description will be given of a model of the growth mechanism that produces variations in the thicknesses of the individual layers of the nitride semiconductor multiple-layer film 121.

It was found that there appeared large variations in the thicknesses of the individual layers of the nitride semiconductor multiple-layer film 121 when the angle θ between the line [0001] normal to the surface 137 of the nitride semiconductor multiple-layer film 121 elsewhere than in the trenches 122 shown in FIG. 12 and the line R normal to the side wall surfaces 122a at the top ends of the trenches 122 was smaller than 60°. In this case, as shown in FIG. 17B, the nitride semiconductor multiple-layer film 121 flowed into the trenches 122. This inflow occurred because, while the nitride semiconductor multiple-layer film 121 was epitaxially grown, a source material (mainly Ga) that had reached the surface 137 was promoted by surface migration to flow into the trenches 122.

Figure 21:
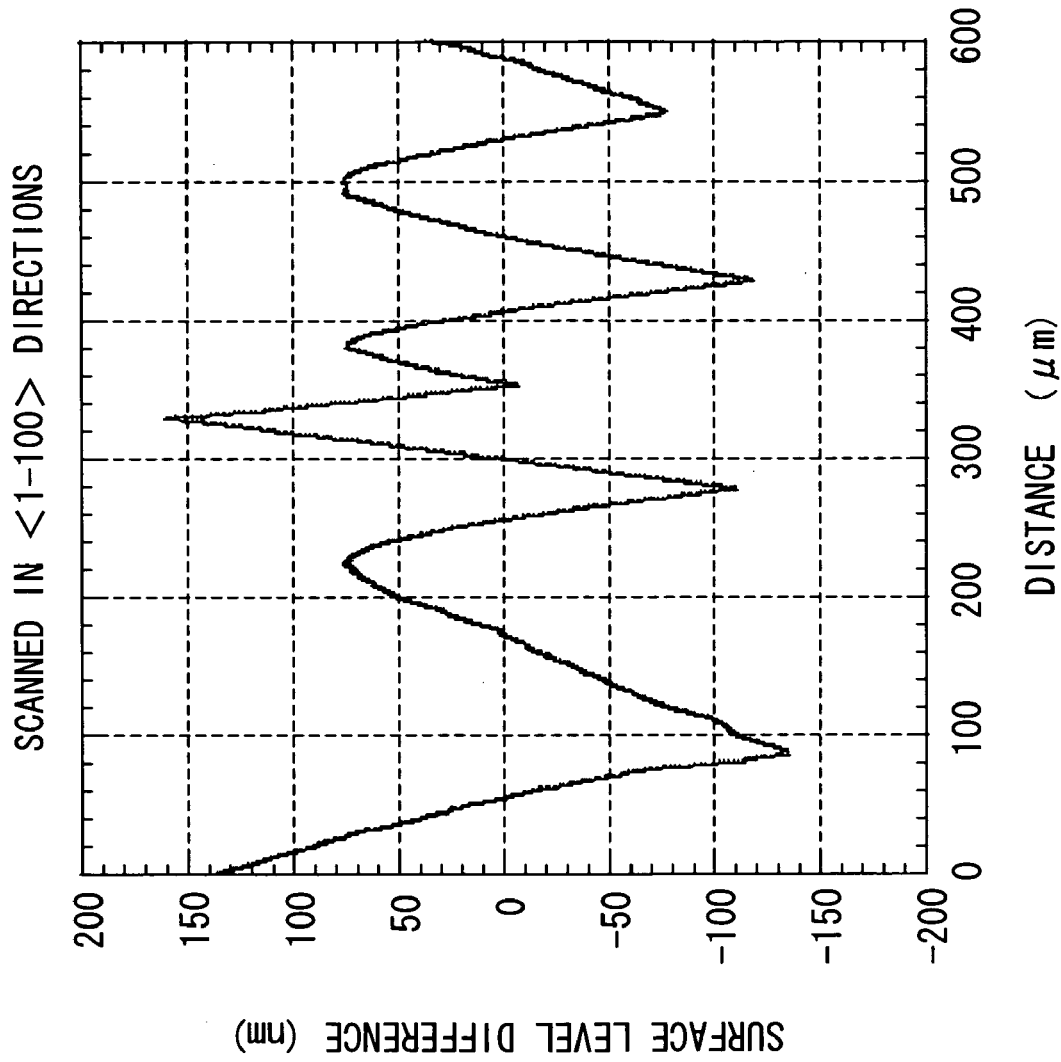
FIG. 21 is a plotting of level variation on the surface of a wafer having a nitride semiconductor growth layer laid on a conventional processed substrate.

As shown in FIG. 21, when the thickness of the primer GaN layer 123 was 1.0 μm, the surface flatness of the nitride semiconductor multiple-layer film 121 was such that the level difference between the highest and lowest parts thereof was as large as 300 nm, indicating that the surface had large surface irregularities.

Moreover, variations in the layer thicknesses of the nitride semiconductor multiple-layer film 121 within the substrate surface were evaluated on a reflection film thickness tester. Here, a refection peak profile obtained from the reflection film thickness tester was subjected to fast-Fourier-transform processing (FFT), and, based on the reflection peaks at the interface between the p-type carrier block layer 129 and the p-type GaN light guide layer 130, between which the difference in refractive index is largest among all the layers, the distribution of the thickness of the p-type layers within the substrate surface was evaluated. Here, the thickness of the p-type layers denotes the total thickness of the following three layers: the p-type GaN light guide layer 130, the p-type AlGaN clad layer 131, and the p-type GaN contact layer 132. As a result, it was found that, when the thickness of the primer GaN layer 123 was 0.5 μm or larger, the degree of variation (standard deviation) of the layer thickness within the substrate surface was 5% or more.

Figure 18:
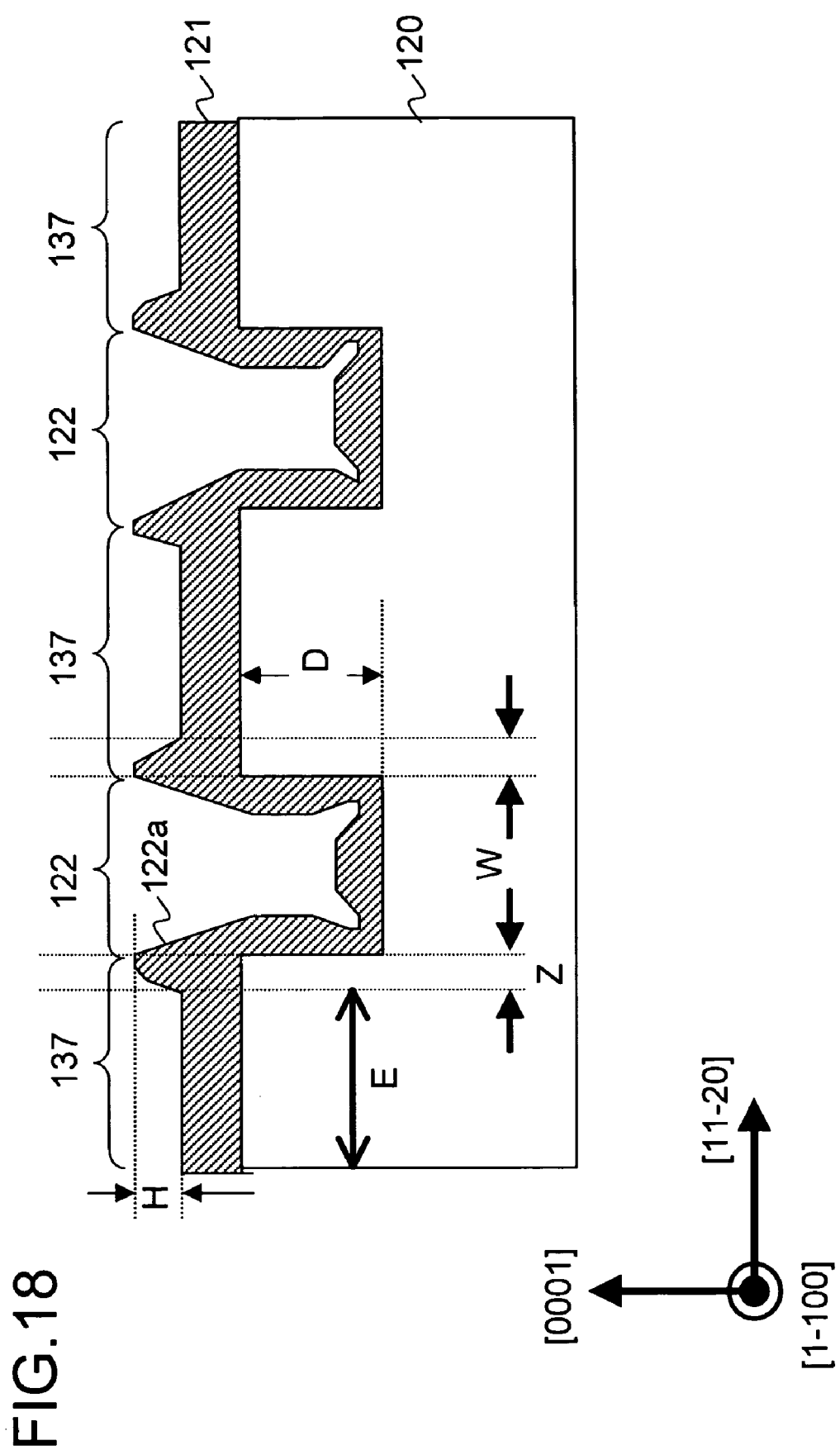
FIG. 18 is a sectional view of a processed substrate having formed thereon a nitride semiconductor multiple-layer film including a primer GaN layer having a thickness of 0.5 µm or less.

Furthermore, under a SEM, growth in the trenches 122 was inspected in detail. What was observed will now be described with reference to FIGS. 12 and 18. FIG. 18 is a sectional view of a processed substrate 120 having a nitride semiconductor multiple-layer film 121 in which the primer GaN layer 123 has a thickness of 0.5 μm or less. FIG. 18 shows that, when the primer GaN layer 123 has a thickness of 0.5 μm or less, the thickness at the upper ends of the trenches 12 is larger by H than the thickness in flat regions E on the surface 137. The thickness difference H is 0.2 to 1.5 μm.

Moreover, in this case, the angle θ between the line [0001] normal to the surface 137 of the nitride semiconductor multiple-layer film 121 elsewhere than in the trenches 122 shown in FIG. 12 and the line R normal to the side wall surfaces 122a of the top ends of the trenches 122 was larger than 60°. A surface with this angle θ equal to 60° is believed to correspond to the (11-22) plane. In this embodiment, the angle θ was 80°. The angle θ should be larger than 60°, and preferably 80° or more. This is because, the farther the angle θ is larger than 60°, the less likely the (11-22) plane, on which inflow easily takes place, appears.

Model of Growth

Based on the results presented thus far, a description will now be given of a model of a growth mode that uses a processed substrate 120 having trenches 122 formed thereon. When the supply of source material gas is started and growth is started, the source material of Ga reaches the surface. Then, Ga migrates on the surface (surface diffusion) and, when it reaches energetically stable sites, it is absorbed by the film. As this is repeated, the film gradually grows. Meanwhile, when the thickness of the primer GaN layer 123 becomes 0.5 μm or more, as shown in FIG. 17B, Ga atoms migrate to flow from the surface 137 toward the trenches 122. During this inflow, for various reasons such as non-uniformity in the trench forming process, the inflow of Ga atoms in the [11-22] direction is extremely non-uniform. Thus, while inflow occurs in some regions, it is less likely to occur in other regions.

Where inflow into the trenches 122 occurs, the surface 137 becomes thinner for reasons related to source material efficiency. Where inflow is less likely to occur, the surface 137 becomes thicker. Thus, poor flatness results. By suppressing this inflow, therefore, it is possible to obtain better flatness. One growth method that suppresses inflow is to grow the primer GaN layer 123 at a higher growth speed at the top ends of the trenches 122 than elsewhere so as to form barrier walls (the thickness difference H in FIG. 18) that prevents the inflow of the Ga source material into the trenches 12. This is effective in making the layer thickness uniform. As described previously, such barrier walls are formed when the primer GaN layer 123 has a layer thickness of 0.5 μm or less.

Moreover, as described previously, it is preferable that the intervals between the trenches 122 be 0.1 mm or more but 4 mm or less. It is preferable that the layer thickness of the primer GaN layer 123 be 0.5 μm ore less. It is preferable that the layer thickness of the primer GaN layer 123 be 15% or less of the total layer thickness of the nitride semiconductor multiple-layer film 121. The angle θ should be larger tan 60°, preferably 80° or more. It is preferable that the depth D of the trenches 122 be 2 μm or more but 20 μm or less, and that the width W of the trenches 122 be 1 μm or more.

Nitride semiconductor devices according to the present invention find wide application in laser devices, light-emitting devices, light-receiving devices, and the like, and can thus be suitably used in optical disk recording/reproducing apparatuses, laser printers, bar code readers, projectors, display apparatuses, and the like.

What is claimed is:

1. A nitride semiconductor device comprising:
   a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, the second width being greater than the first width, and
   a nitride semiconductor growth layer composed of a plurality of nitride semiconductor thin films grown in the trench and on the ridge portion of the processed substrate,
   the nitride semiconductor growth layer being laid with a principal plane direction aligned with a {0001} plane,
   wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less,
   wherein the nitride semiconductor device in finished form includes the processed substrate with the trench and the ridge portion on its uppermost surface, and
   wherein the second width of the ridge portion is 100 μm or more but 2,000 μm or less.

2. The nitride semiconductor device of claim 1,
   wherein the off-angle of the processed substrate is composed of
   a first off-angle, which is an angle between the second vector and a third vector obtained by projecting the first vector onto a first plane formed by, of the crystal direction <0001>, a crystal direction <11-20>, and a crystal direction <1-100>, which are perpendicular to one another, the crystal direction <0001> and the crystal direction <1-100> when the first and third vectors are assumed to start at a same point, and a second off-angle, which is an angle between the second vector and a fourth vector obtained by projecting the second vector onto a second plane formed by, of the crystal direction <0001>, the crystal direction <11-20>, and the crystal direction <1-100>, which are perpendicular to one another, the crystal direction <0001> and the crystal direction <11-20> when the second and fourth vectors are assumed to start at a same point.

3. The nitride semiconductor device of claim 2, wherein the first off-angle is θa, the second off-angle is θb, and |θa|≧|θb|.

4. The nitride semiconductor device of claim 3, wherein 0.09°≦|θa|°.

5. The nitride semiconductor device of claim 3, wherein 3×|θb|°<|θa|°<0.09 and simultaneously 0.05≦|θa|°.

6. The nitride semiconductor device of claim 2, wherein the first off-angle is θa, the second off-angle is θb, and |θa|≦|θb|.

7. The nitride semiconductor device of claim 6, wherein 0.2°≦|θb|°.

8. The nitride semiconductor device of claim 1, wherein the concave area formed as the trench extends in a form of a stripe, and a direction in which the concave area extends is parallel or substantially parallel to a crystal direction <1-100>.

9. The nitride semiconductor device of claim 1, wherein the concave area formed as the trench extends in a form of a stripe, and a direction in which the concave area extends is parallel or substantially parallel to a crystal direction <11-20>.

10. The nitride semiconductor device of claim 2, wherein the concave area formed as the trench is formed in a form of a lattice, and, of two mutually perpendicular directions in which the lattice extends, one is parallel or substantially parallel to the crystal direction <11-20> and the other is parallel or substantially parallel to the crystal direction <1-100>.

11. The nitride semiconductor device of claim 10, wherein the first off-angle is θa, the second off-angle is θb, a direction parallel to longer sides of the ridge is parallel or substantially parallel to the crystal direction <1-100>, and |θa|≧|θb|.

12. The nitride semiconductor device of claim 10, wherein the first off-angle is θa, the second off-angle is θb, a direction parallel to longer sides of the ridge is parallel or substantially parallel to the crystal direction <11-20>, and |θa|≦|θb|.

13. The nitride semiconductor device of claim 2, wherein a square root of a sum of a square of the first off-angle and a square of the second off-angle is 0.2° or more.

14. The nitride semiconductor device of claim 1, wherein the nitride semiconductor thin film that makes contact with the surface of the processed substrate is GaN having a thickness of 0.5 μm or less or AlGaN.

15. The nitride semiconductor device of claim 1, wherein a total thickness of the nitride semiconductor growth layer formed on the ridge is T, and a depth of the concave area formed as the trench is T/2 or more.

16. The nitride semiconductor device of claim 1, wherein, when the nitride semiconductor growth layer composed of the plurality of nitride semiconductor thin films is formed, at least one of the nitride semiconductor thin films is grown under conditions that a surface temperature of the processed substrate is 1 050° C. or less and that a ratio of a flow rate in moles per unit time at which a source material containing a group V atom is supplied to a flow rate in moles per unit time at which a source material containing a group III atom is supplied is 2 250 or more.

17. The nitride semiconductor device of claim 2, wherein 0.09°≦|θa|°.

18. A nitride semiconductor device comprising:
a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, a line coinciding with the first width being contiguous with a line coinciding with the second width, the second width formed by the uppermost surface of the ridge portion, the second width being greater than the first width, and
a nitride semiconductor growth layer composed of a plurality of nitride semiconductor thin films grown in the trench and on the ridge portion of the processed substrate,
the nitride semiconductor growth layer being laid with a principal plane direction aligned with a {0001} plane,
wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less, and
wherein the second width of the ridge portion is 100 μm or more but 2,000 μm or less.

19. A nitride semiconductor device comprising:
a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, the second width being greater than the first width, and
a nitride semiconductor growth layer composed of a plurality of nitride semiconductor thin films grown in the trench and on the ridge portion of the processed substrate,
the nitride semiconductor growth layer being laid with a principal plane direction aligned with a {0001} plane,
wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less,
wherein the nitride semiconductor device in finished form includes the processed substrate with the trench and the ridge portion on its uppermost surface, and
wherein a depth of the trench is 1.5 μm or more.

20. A nitride semiconductor device comprising:
a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, the second width being greater than the first width, and a nitride semiconductor growth layer composed of a plurality of nitride semiconductor thin films grown in the trench and on the ridge portion of the processed substrate, the nitride semiconductor growth layer being laid with a principal plane direction aligned with a {0001} plane, wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less, wherein the nitride semiconductor device in finished form includes the processed substrate with the trench and the ridge portion on its uppermost surface, and wherein the first width of the trench is 3 μm or more.

21. A nitride semiconductor device comprising:

a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, a line coinciding with the first width being contiguous with a line coinciding with the second width, the second width formed by the uppermost surface of the ridge portion, the second width being greater than the first width, and a nitride semiconductor growth layer composed of a plurality of nitride semiconductor thin films grown in the trench and on the ridge portion of the processed substrate, the nitride semiconductor growth layer being laid with a principal plane direction aligned with a {0001} plane, wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less, and wherein a depth of the trench is 1.5 μm or more.

22. A nitride semiconductor device comprising:

a processed substrate formed by forming, on a surface of a nitride semiconductor substrate of which at least a surface is formed of a nitride semiconductor, a trench as at least one concave area in an etching process and a ridge portion as a non-trench, the trench having a first width and the ridge portion having a second width, a line coinciding with the first width being contiguous with a line coinciding with the second width, the second width formed by the uppermost surface of the ridge portion, the second width being greater than the first width, and a nitride semiconductor growth layer composed of a plurality of nitride semiconductor thin films grown in the trench and on the ridge portion of the processed substrate, the nitride semiconductor growth layer being laid with a principal plane direction aligned with a {0001} plane, wherein an off-angle, which is an angle between a first vector extending from a surface portion of the ridge in a direction normal thereto and a second vector extending parallel to a crystal direction <0001> when the first and second vectors are assumed to start at a same point, is 0.05° or more but 4° or less, and wherein the first width of the trench is 3 μm or more.

* * * * *